US010630295B2

(12) United States Patent
Seno

(10) Patent No.: US 10,630,295 B2
(45) Date of Patent: Apr. 21, 2020

(54) DEVICE AND METHOD FOR DETECTING SIGNAL STATE TRANSITION

(71) Applicant: SYNAPTICS INCORPORATED, San Jose, CA (US)

(72) Inventor: Takefumi Seno, Tokyo (JP)

(73) Assignee: SYNAPTICS INCORPORATED, San Jose, CA (US)

(*) Notice: Subject to any disclaimer, the term of this patent is extended or adjusted under 35 U.S.C. 154(b) by 0 days.

(21) Appl. No.: 16/380,743

(22) Filed: Apr. 10, 2019

(65) Prior Publication Data
US 2019/0326912 A1  Oct. 24, 2019

(30) Foreign Application Priority Data

Apr. 23, 2018 (JP) .................. 2018-082533
Dec. 20, 2018 (JP) .................. 2018-238289

(51) Int. Cl.
H03K 19/177 (2020.01)
G06F 1/10 (2006.01)
H03K 19/20 (2006.01)
H03K 19/17736 (2020.01)

(52) U.S. Cl.
CPC .......... *H03K 19/1774* (2013.01); *G06F 1/10* (2013.01); *H03K 19/20* (2013.01)

(58) Field of Classification Search
CPC ....... H03K 19/1774; H03K 19/20; G06F 1/10
USPC .......................................... 326/93
See application file for complete search history.

(56) References Cited

U.S. PATENT DOCUMENTS

2007/0279090 A1* 12/2007 Gliese ............... H03K 19/1733
                                                           326/59
2014/0240611 A1*  8/2014 Kimura ............... G02B 27/48
                                                           348/750

FOREIGN PATENT DOCUMENTS

JP         2017112427 A        6/2017

* cited by examiner

Primary Examiner — Don P Le
(74) Attorney, Agent, or Firm — Patterson + Sheridan, LLP

(57) ABSTRACT

Semiconductor circuitry comprises a plurality of signal transition detectors and dynamic OR circuitry. The plurality of signal transition detectors are configured to respectively output detection signals, each of the detection signals being based on a transition of at least one of a plurality of signals. The dynamic OR circuitry is configured to output a recovered clock signal based on a logical sum of the detection signals.

18 Claims, 16 Drawing Sheets

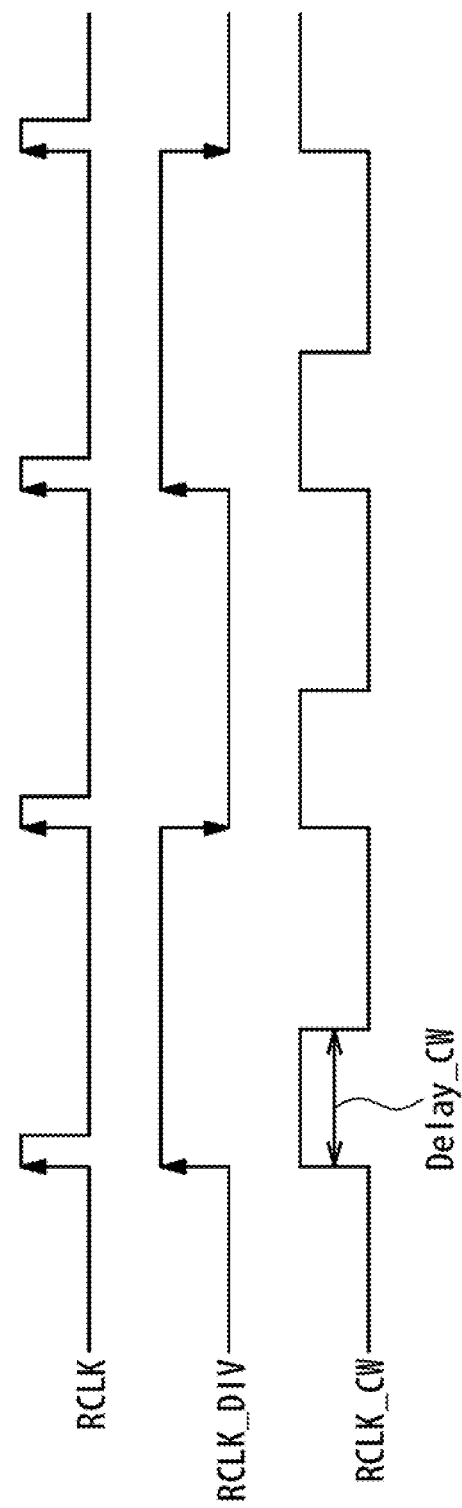

DEVICE AND METHOD FOR DETECTING SIGNAL STATE TRANSITION

CROSS REFERENCE

This application claims priority to Japanese Patent Application No. 2018-82533, filed on Apr. 23, 2018 and Japanese Patent Application No. 2018-238289, filed on Dec. 20, 2018, the disclosures of which are incorporated herein by reference in their entireties.

BACKGROUND

Field

The present disclosure relates to semiconductor circuitry, a data transfer system, and a method of operating semiconductor circuitry.

Description of the Related Art

Semiconductor circuitry may integrate detection circuitry configured to detect signal state transition. Such detection circuitry may be used, for example, for clock recovery to recover a clock signal from a data signal in which clock information is embedded. Detection circuitry configured to detect signal state transition may be designed to achieve high-speed operation. For example, a high-speed operation of detection circuitry may enhance the data transfer rate of a data transfer system when the detection circuitry is used for clock recovery in the data transfer system.

SUMMARY

In one or more embodiments, semiconductor circuitry comprises a plurality of signal transition detectors configured to respectively output detection signals based on a transition of at least one of a plurality of signals, and dynamic OR circuitry configured to output a recovered clock signal based on a logical sum of the detection signals.

In one or more embodiments, a data transfer system comprises transmitter circuitry configured to respectively output data signals to first, second, and third wires and receiver circuitry. The receiver circuitry comprises first and second differential receivers each comprising inputs connected to a different two of the first, second, and third wires, first and second signal transition detectors configured to receive first and second input signals from the first and second differential receivers, respectively. The first and second input signals are complementary to each other. The receiver circuitry further comprises dynamic OR circuitry configured to output a recovered clock signal based on a logical sum of detection signals received from the first and second signal transition detectors.

In one or more embodiments, a method of operating semiconductor circuitry comprises respectively outputting detection signals from a plurality of signal transition detectors based on a transition of at least one of a plurality of signals, and outputting a recovered clock signal based on a logical sum of the detection signals by dynamic OR circuitry.

BRIEF DESCRIPTION OF THE DRAWINGS

So that the manner in which the above recited features of the present disclosure may be understood in detail, a more particular description of the disclosure, briefly summarized above, may be had by reference to embodiments, some of which are illustrated in the appended drawings. It is to be noted, however, that the appended drawings illustrate only some embodiments of this disclosure and are therefore not to be considered limiting of its scope, for the disclosure may admit to other equally effective embodiments.

FIG. 9 is a timing chart illustrating an operation of the clock pulse expanding circuitry illustrated in FIG. 8, according to one or more embodiments.

DETAILED DESCRIPTION

Figure 1:
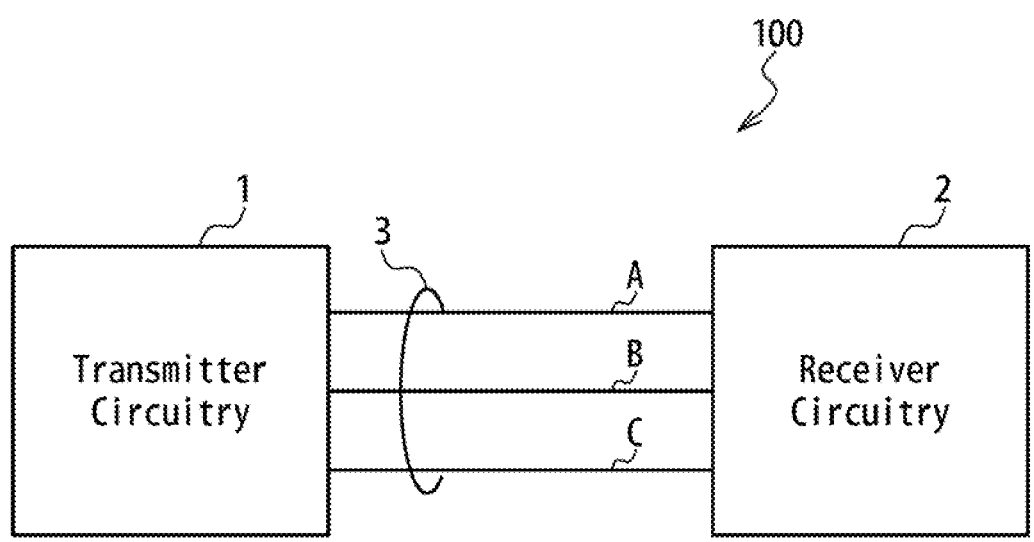
FIG. 1 is a block diagram illustrating a configuration of a data transfer system, according to one or more embodiments.

In one or more embodiments, as illustrated in FIG. 1, a data transfer system 100 comprises transmitter circuitry 1 and receiver circuitry 2. In one or more embodiments, the data transfer system 100 supports the MIPI C-PHY standard, but not limited to this. In one or more embodiments, the transmitter circuitry 1 is connected to the receiver circuitry 2 via a lane 3. In one or more embodiments, the transmitter circuitry 1 and the receiver circuitry 2 may be integrated in separate semiconductor chips.

In one or more embodiments, the lane 3 comprises three wires A, B, and C configured to transfer data signals, respectively. In one or more embodiments, these data signals are generated in accordance with the MIPI C-PHY standard. In one or more embodiments, the wires A, B, and C are each allowed to take three potentials; these three potentials may be hereinafter referred to as "H", "M", and "L", respectively. In one or more embodiments, one of the wires A, B, and C is set to an "H" level in each unit interval (UI) of data transfer, another is set to an "M" level, and the other is set to an "L" level. In one or more embodiments, the total number of combinations of the potentials on the wires A, B, and C is six. In one or more embodiments, a symbol transmitted in each UI is represented as a combination of the potentials on the wires A, B, and C. In the following, the potentials on the wires A, B, and C may be denoted as $V_A$, $V_B$, and $V_C$, respectively. When a certain symbol is transmitted after a previous symbol is transmitted with a certain combination of the potentials $V_A$, $V_B$, and $V_C$ on the wires A, B, and C, the potentials $V_A$, $V_B$, and $V_C$ are switched to a different combination from that used in the transmission of the previous symbol, in one or more embodiments.

In one or more embodiments, clock information is embedded in the data signals transmitted over the wires A, B, and C. In one or more embodiments, the clock information is embedded in the data signals in the form of timing of state transitions of the data signals, for example, timing at which the potentials $V_A$, $V_B$, and $V_C$ on the wires A, B, and C are flipped. In one or more embodiments, the receiver circuitry 2 is configured to perform clock recovery based on the data signals transmitted over the wires A, B, and C to generate a recovered clock signal used for reception of the data signals.

Figure 2:
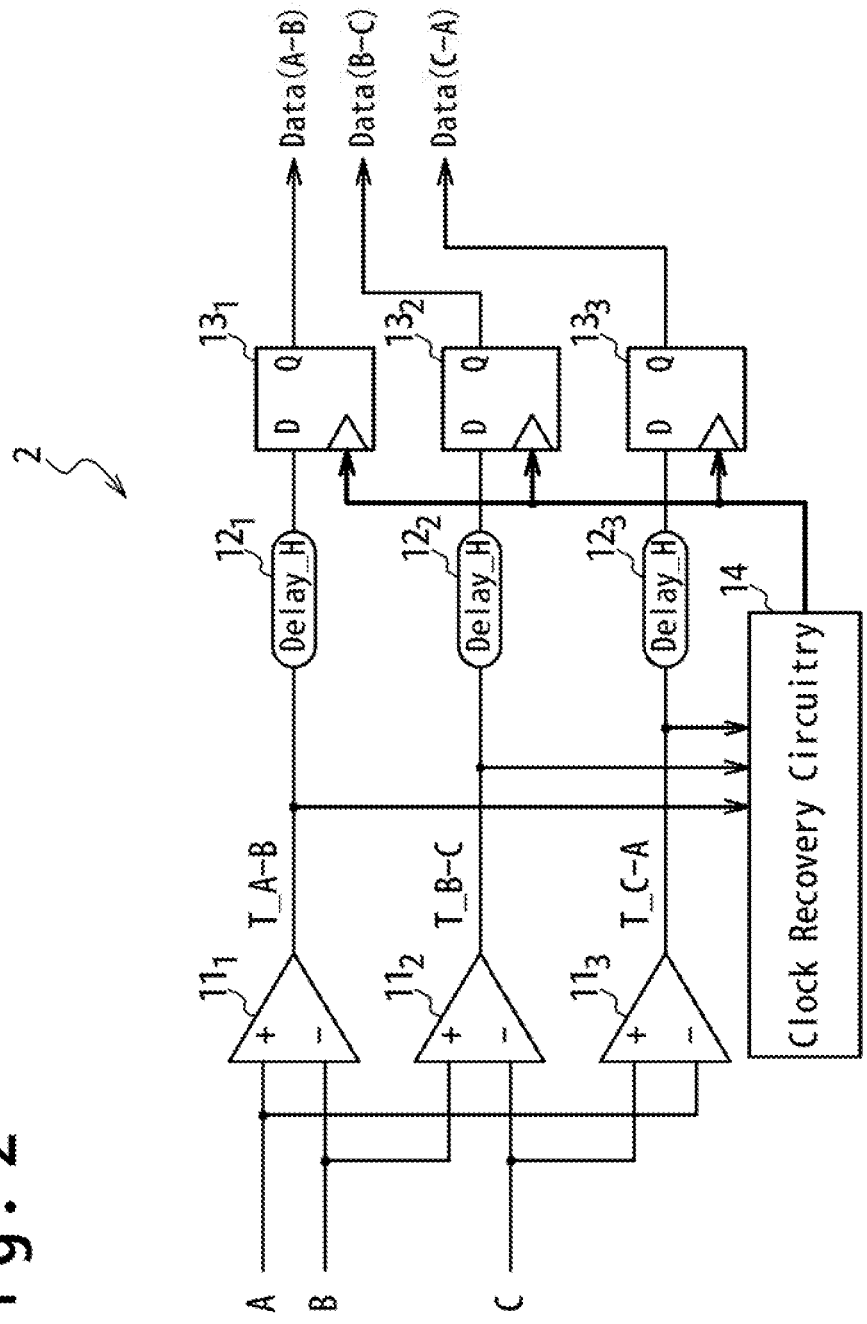
FIG. 2 is a block diagram illustrating a configuration of receiver circuitry, according to one or more embodiments.

In one or more embodiments, as illustrated in FIG. 2, the receiver circuitry 2 is configured as semiconductor circuitry comprising a differential receivers $11_1$ to $11_3$, hold delay circuitries $12_1$ to $12_3$, data latches $13_1$ to $13_3$, and clock recovery circuitry 14.

In one or more embodiments, the differential receivers $11_1$, $11_2$, and $11_3$ are configured to respectively generate single ended signals T_A-B, T_B-C, and T_C-A which respectively correspond to the voltage $V_A$-$V_B$ between the wires A and B, the voltage $V_B$-$V_C$ between the wires B and C, and the voltage $V_C$-$V_A$ between the wires C and A. In one or more embodiments, the differential receiver $11_1$ comprises a non-inverting input connected to the wire A and an inverting input connected to the wire B, and is configured to output the single ended signal T_A-B so that the single ended signal T_A-B has a logical value corresponding to the voltage $V_A$-$V_B$. In one or more embodiments, the differential receiver $11_2$ comprises a non-inverting input connected to the wire B and an inverting input connected to the wire C, and is configured to output the single ended signal T_B-C so that the single ended signal T_B-C has a logical value corresponding to the voltage $V_B$-$V_C$. In one or more embodiments, the differential receiver $11_3$ comprises a non-inverting input connected to the wire C and an inverting input connected to the wire A, and is configured to output the single ended signal T_C-A so that the single ended signal T_C-A has a logical value corresponding to the voltage $V_C$-$V_A$. In one or more embodiments, the single ended signal T_A-B takes a logical value "1" when the potential $V_A$ on the wire A is higher than the potential $V_B$ on the wire B, and takes a logical value "0" when the potential $V_A$ on the wire A is lower than the potential $V_B$ on the wire B. A similar approach may be applied to the single ended signals T_B-C and T_C-A, in one or more embodiments.

In one or more embodiments, the hold delay circuitries $12_1$, $12_2$, and $12_3$ are configured to respectively delay the single ended signals T_A-B, T_B-C, and T_C-A received from the differential receivers $11_1$, $11_2$, and $11_3$ by a predetermined delay time Delay_H. In one or more embodiments, the hold delay circuitries $12_1$, $12_2$, and $12_3$ are respectively configured to delay the single ended signals T_A-B, T_B-C, and T_C-A so that sufficient hold times are provided for the data latches $13_1$, $13_2$, and $13_3$.

In one or more embodiments, the data latches $13_1$, $13_2$, and $13_3$ are respectively configured to latch the single ended signals T_A-B, T_B-C, and T_C-A delayed by the hold delay circuitries $12_1$, $12_2$, and $12_3$, respectively, in synchronization with a recovered clock signal RCLK supplied from the clock recovery circuitry 14 and output latched data signals Data(A-B), Data(B-C), and Data(C-A) having the latched logical values.

In one or more embodiments, the clock recovery circuitry 14 is configured to generate the recovered clock signal RCLK through clock recovery based on the clock information embedded in the data signals transmitted over the wires A, B, and C and supply the recovered clock signal RCLK to the data latches $13_1$ to $13_3$.

Figure 3:
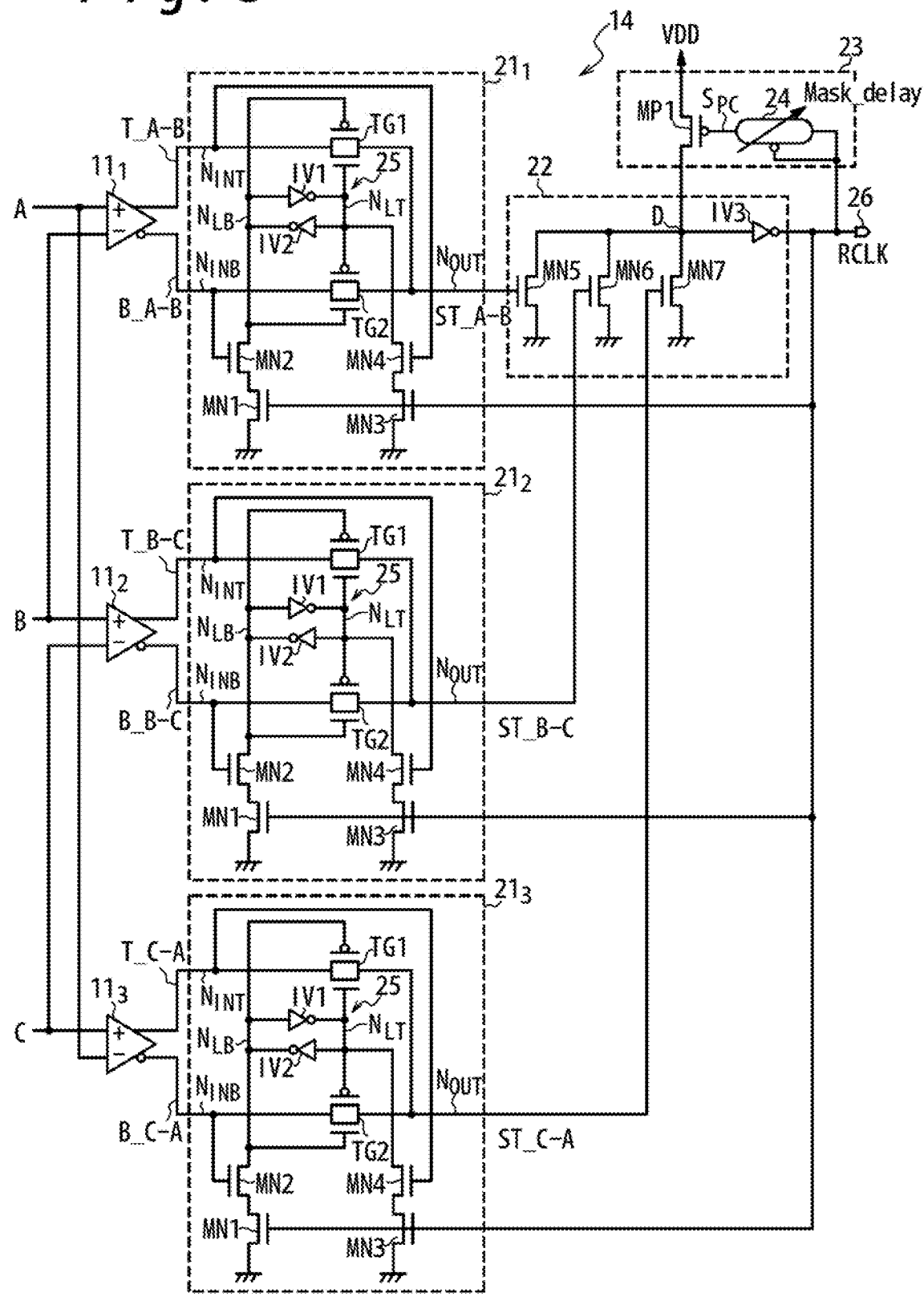
FIG. 3 is a circuitry diagram illustrating a configuration of clock recovery circuitry, according to one or more embodiments.

In one or more embodiments, as illustrated in FIG. 3, the clock recovery circuitry 14 is configured to receive the single ended signals T_A-B, T_B-C, T_C-A and complementary single ended signals B_A-B, B_B-C, and B_C-A from the differential receivers $11_1$, $11_2$, and $11_3$, respectively. In one or more embodiments, the complementary single ended signals B_A-B, B_B-C, and B_C-A have logical values complementary to those of the single ended signals T_A-B, T_B-C, T_C-A, respectively. Note that the complementary single ended signals B_A-B, B_B-C, and B_C-A are not illustrated in FIG. 2.

In one or more embodiments, the clock recovery circuitry 14 comprises signal transition detectors $21_1$ to $21_3$, dynamic OR circuitry 22, and precharge circuitry 23.

In one or more embodiments, the signal transition detector $21_1$ is configured to receive the single ended signal T_A-B and the complementary single ended signal B_A-B and detect transitions of the single ended signal T_A-B and the complementary single ended signal B_A-B to generate a detection signal ST_A-B. In one or more embodiments, the signal transition detector $21_1$ comprises two input nodes $N_{INT}$, $N_{INB}$, an output node $N_{OUT}$, transmission gates TG1, TG2, inverters IV1, IV2, and NMOS transistors MN1 to MN4.

In one or more embodiments, the input node $N_{INT}$ is connected to a first output of the differential receiver $11_1$ to receive the single ended signal T_A-B from the differential receiver $11_1$. In one or more embodiments, the input node $N_{INB}$ is connected to a second output of the differential receiver $11_1$ to receive the complementary single ended signal B_A-B from the differential receiver $11_1$. In one or more embodiments, the output node $N_{OUT}$ outputs the detection signal ST_A-B generated by the signal transition detector $21_1$ to the dynamic OR circuitry 22.

In one or more embodiments, the transmission gate TG1 is connected between the input node $N_{INT}$ and the output node $N_{OUT}$ and configured to electrically connect and disconnect the input node $N_{INT}$ and the output node $N_{OUT}$. In one or more embodiments, the transmission gate TG2 is connected between the input node $N_{INB}$ and the output node $N_{OUT}$ and configured to electrically connect and disconnect the input node $N_{INB}$ and the output node $N_{OUT}$.

In one or more embodiments, the inverters IV1 and IV2 are cross-coupled to form a binary latch 25. In one or more embodiments, the inverter IV1 comprises an input connected to a node $N_{LB}$ and an output connected to a node $N_{LT}$. In one or more embodiments, the inverter IV2 comprises an input connected to a node $N_{LT}$ and an output connected to a node $N_{LB}$. In one or more embodiments, the nodes $N_{LB}$ and $N_{LT}$ are used to hold the state of the binary latch 25; complementary logical values are held on the nodes $N_{LB}$ and $N_{LT}$.

Overall, the transmission gates TG1, TG2, and the binary latch 25 operate as a selector configured to output a selected one of the single ended signal T_A-B and the complementary single ended signal B_A-B based on the state of the binary latch 25, in one or more embodiments. In one or more embodiments, allowed states of the binary latch 25 comprise a first state in which the transmission gate TG1 is turned on and the transmission gate TG2 is turned off and a second state in which the transmission gate TG1 is turned off and the transmission gate TG2 is turned on. In one or more embodiments, the transmission gates TG1 and TG2 are controlled based on the state of the binary latch 25.

In one or more embodiments, the NMOS transistors MN1 and MN2 are connected in series between the node $N_{LB}$ and a circuit ground, that is, a node of a circuit ground potential. In one or more embodiments, the gate of the NMOS transistor MN1 is connected to an output terminal 26 of the clock recovery circuitry 14 to receive the recovered clock signal RCLK. In one or more embodiments, the gate of the NMOS transistor MN2 is connected to the input node $N_{INB}$ to receive the complementary single ended signal B_A-B. In one or more embodiments, when the recovered clock signal RCLK and the complementary single ended signal B_A-B are both set to the high level, the NMOS transistors MN1 and MN2 electrically connect the node $N_{LB}$ to the circuit ground and thereby pull down the node $N_{LB}$ to the low level. In one or more embodiments, the positions of the NMOS transistors MN1 and MN2 are interchangeable.

In one or more embodiments, the NMOS transistors MN3 and MN4 are connected in series between the node $N_{LB}$ and the circuit ground. In one or more embodiments, the gate of the NMOS transistor MN3 is connected to the output terminal 26 of the clock recovery circuitry 14 to receive the recovered clock signal RCLK. In one or more embodiments, the gate of the NMOS transistor MN4 is connected to the input node $N_{INT}$ to receive the single ended signal T_A-B. In one or more embodiments, when the recovered clock signal RCLK and the single ended signal T_A-B are both set to the high level, the NMOS transistors MN3 and MN4 electrically connect the node $N_{LT}$ to the circuit ground and thereby pull down the node $N_{LT}$ to the low level. In one or more embodiments, the positions of the NMOS transistors MN3 and MN4 are interchangeable.

In one or more embodiments, the NMOS transistors MN1 to MN4 operate as state setting circuitry configured to set the state of the binary latch 25 based on the single ended signal T_A-B and the complementary single ended signal B_A-B, when enabled by the recovered clock signal RCLK, for example, when the recovered clock signal RCLK is asserted and set to the high level.

In one or more embodiments, the signal transition detectors $21_2$ and $21_3$ are configured and operate similarly to the signal transition detector $21_1$ except for that different signals are inputted to the input nodes $N_{INT}$ and $N_{INB}$ and different signals are outputted from the signal transition detectors $21_2$ and $21_3$. In one or more embodiments, the signal transition detector $21_2$ is configured to receive the single ended signal T_B-C from the differential receiver $11_2$ on the input node $N_{INT}$ and receive the complementary single ended signal B_B-C from the differential receiver $11_2$ on the input node $N_{INB}$. In one or more embodiments, the signal transition detector $21_2$ is configured to detect transitions of the single ended signal T_B-C and the complementary single ended signal B_B-C to output the detection signal ST_B-C from the output node $N_{OUT}$. In one or more embodiments, the signal transition detector $21_3$ is configured to receive the single ended signal T_C-A from the differential receiver $11_3$ on the input node $N_{INT}$ and receive the complementary single ended signal B_C-A from the differential receiver $11_3$ on the input node $N_{INB}$. In one or more embodiments, the signal transition detector $21_3$ is configured to detect transitions of the single ended signal T_C-A and the complementary single ended signal B_C-A to output the detection signal ST_C-A from the output node $N_{OUT}$.

In one or more embodiments, the dynamic OR circuitry 22 is configured as a dynamic circuit outputting to the output terminal 26 a signal of a logical sum of the detection signals ST_A-B, ST_B-C, and ST_C-A received from the signal transition detectors $21_1$, $21_2$, and $21_3$, respectively. In one or more embodiments, an output signal from the dynamic OR circuitry 22 is used as the recovered clock signal RCLK. In one or more embodiments, the use of the dynamic OR circuitry 22 makes it possible to rapidly assert the recovered clock signal RCLK when any of the single ended signals T_A-B, T_B-C, and T_C-A supplied to the signal transition detectors $21_1$, $21_2$, and $21_3$ are flipped. This may contribute to high-speed operation of the clock recovery circuitry 14. In one or more embodiments, the recovered clock signal RCLK is generated as a high-active signal. In one or more embodiments, the recovered clock signal RCLK is set to the high level when asserted and to the low level when deasserted.

In one or more embodiments, the dynamic OR circuitry 22 comprises NMOS transistors MN5, MN6, MN7, and an inverter IV3. In one or more embodiments, the NMOS transistors MN5, MN6, and MN7 are connected in parallel between dynamic node D and a node of a predetermined potential. In one or more embodiments, the node of the predetermined potential comprises the circuit ground. In one or more embodiments, the detection signals ST_A-B, ST_B-C, and ST_C-A are supplied to the gates of the NMOS transistors MN5, MN6, and MN7, respectively. In one or more embodiments, the inverter IV3 is configured to output a signal having a logical value complementary to that of the dynamic node D as the recovered clock signal RCLK.

In one or more embodiments, the precharge circuitry 23 is configured to precharge the dynamic node D of the dynamic OR circuitry 22. In one or more embodiments, the precharge circuitry 23 comprises variable delay circuitry 24 and a PMOS transistor MP1.

In one or more embodiments, the variable delay circuitry 24 is configured to supply a precharge signal $S_{PC}$ to the PMOS transistor MP1 based on a signal level of the recovered clock signal RCLK. In one or more embodiments, the variable delay circuitry 24 is configured to assert the precharge signal $S_{PC}$ when a predetermined delay time Mask_delay lapses after the recovered clock signal RCLK is asserted. In one or more embodiments, the variable delay circuitry 24 is further configured to be reset and immediately deassert the precharge signal $S_{PC}$ when the recovered clock signal RCLK is deasserted. In FIG. 3, the small circle attached to the circuit symbol indicating the variable delay circuitry 24 represents the reset function. In one or more embodiments, the precharge signal $S_{PC}$ is a low-active signal. In one or more embodiments, the precharge signal $S_{PC}$ is set to the low level when asserted, and set to the high level when deasserted.

In one or more embodiments, the variable delay circuitry 24 is configured so that the delay time Mask_delay thereof is variable. In one or more embodiments, the variable delay circuitry 24 may comprise a register specifying the delay time Mask_delay.

In one or more embodiments, the PMOS transistor MP1 comprises a source connected to the dynamic node D, a drain connected to a node of a power supply potential VDD, and a gate receiving the precharge signal $S_{PC}$. In one or more embodiments, the PMOS transistor MP1 is configured to precharge the dynamic node D to the power supply potential VDD based on the precharge signal $S_{PC}$. In one or more embodiments, when the precharge signal $S_{PC}$ is asserted or set to the low level, the PMOS transistor MP1 is turned on to precharge the dynamic node D to the power supply potential VDD.

In one or more embodiments, the clock recovery circuitry 14 is configured to assert the recovered clock signal RCLK in each UI in synchronization with the earliest one of zero crossing times of the voltage $V_A$-$V_B$ between the wires A and B, the voltage $V_B$-$V_C$ between the wires B and C, and the voltage $V_C$-$V_A$ between the wires C and A. In one or more embodiments, the single ended signals T_A-B, T_B-C, and T_C-A are flipped in synchronization with the zero crossing times of the voltages $V_A$-$V_B$, $V_B$-$V_C$, and $V_C$-$V_A$, respectively, and the recovered clock signal RCLK is asserted in each UI in synchronization with the earliest one of the times when the single ended signals T_A-B, T_B-C, and T_C-A are flipped. In one or more embodiments, the recovered clock signal RCLK is deasserted when a predetermined time lapses after the recovered clock signal RCLK is asserted, and this results in that a clock pulse appears in the recovered clock signal RCLK.

Figure 4:
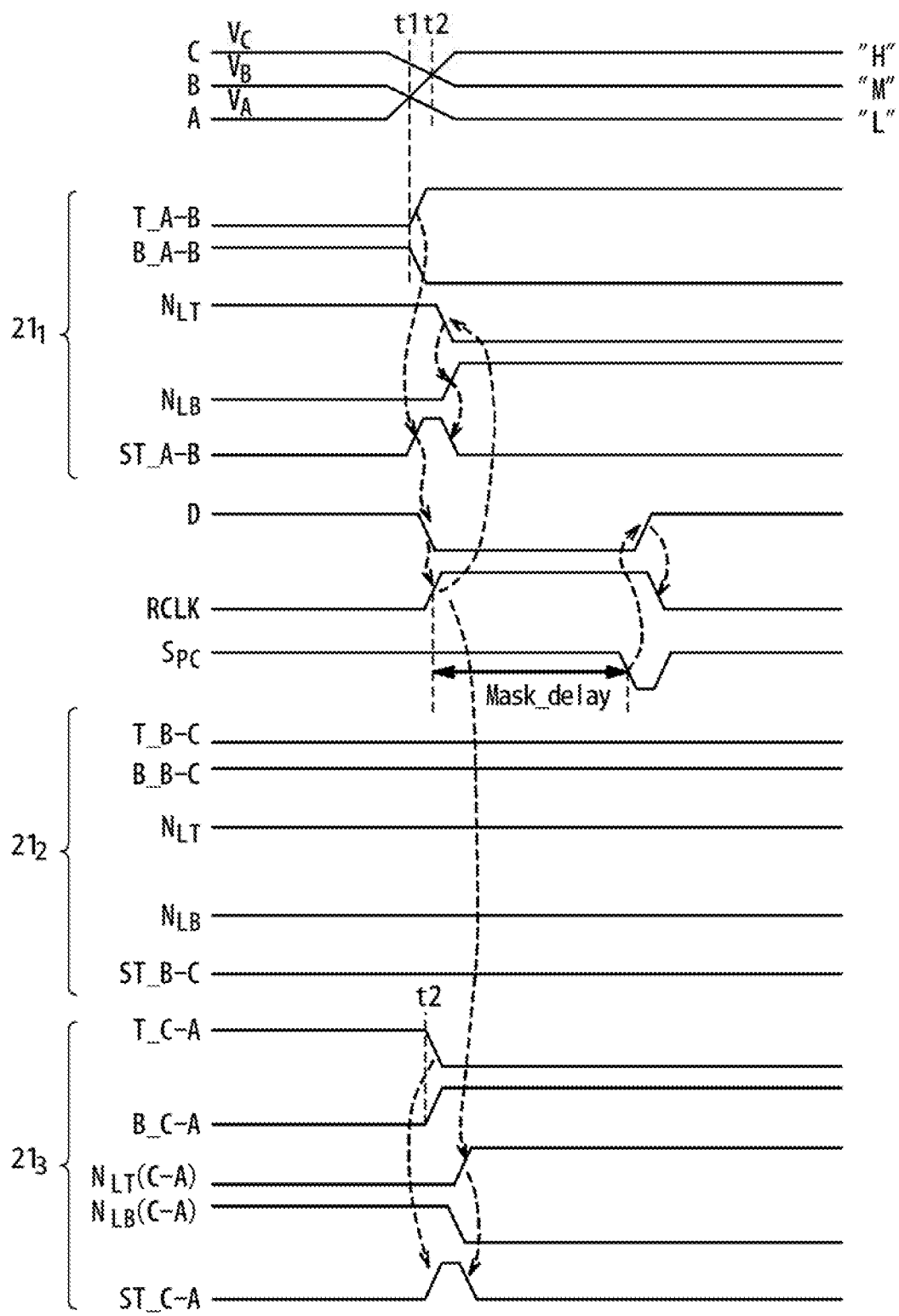
FIG. 4 is a timing chart illustrating an operation of the clock recovery circuitry illustrated in FIG. 3, according to one or more embodiments.

In one or more embodiments, as illustrated in FIG. 4, the states of the wires A, B, and C are switched at the beginning of each UI, based on a symbol to be transmitted. In one or more embodiments, when the zero crossing time of the voltage $V_A$-$V_B$ between the wires A and B is the earliest, that is, when the timing at which the single ended signal T_A-B is flipped is the earliest, the recovered clock signal RCLK is asserted in synchronization with the timing at which the single ended signal T_A-B is flipped.

In one or more embodiments, the wires A, B, and C are set to the potentials "L", "M", and "H", respectively, in an initial state. In this state, the single ended signals T_A-B, T_B-C are set to the low level and the single ended signal T_C-A is set to the high level, while the complementary single ended signals B_A-B, B_B-C are set to the high level and the complementary single ended signal B_C-A is set to the low level. In one or more embodiments, the dynamic node D is precharged to the high level and the recovered clock signal RCLK is set to the low level in the initial state.

In one or more embodiments, the signal transition detectors $21_1$, $21_2$, and $21_3$ respectively set the detection signals ST_A-B, ST_B-C, and ST_C-A to the low level in the initial state. In one or more embodiments, the binary latches 25 of the signal transition detectors $21_1$ and $21_2$ are placed in a state in which the single ended signals T_A-B and T_B-C are selected and outputted from the signal transition detectors $21_1$ and $21_2$, that is, a state in which the nodes $N_{LT}$ of the signal transition detectors $21_1$ and $21_2$ are set to the high level and the nodes $N_{LB}$ of the same are set to the low level. In one or more embodiments, the binary latch 25 of the signal transition detector $21_3$ is placed in a state in which the single ended signal B_C-A is selected and outputted from the signal transition detector $21_3$, that is, a state in which the node $N_{LT}$ of the signal transition detector $21_3$ is set to the low level and the node $N_{LB}$ of the same is set to the high level.

In one or more embodiments, when the wires A, B, and C are then switched to the potentials "H", "L", and "M", respectively, zero crossings occur with respect to the voltage $V_A$-$V_B$ between the wires A and B and the voltage $V_C$-$V_A$ between the wires C and A. In one or more embodiments, as illustrated in FIG. 4, the zero crossing time $t_1$ of the voltage $V_A$-$V_B$ is earlier than the zero crossing time $t_2$ of the voltage $V_C$-$V_A$, and a clock pulse is generated in the recovered clock signal RCLK in synchronization with the zero crossing time $t_1$ of the voltage $V_A$-$V_B$.

In one or more embodiments, at the time $t_1$, the single ended signal T_A-B is switched to the high level and the complementary single ended signal B_A-B is switched to the low level. In one or more embodiments, the signal transition detector $21_1$ is placed in a state to output the single ended signal T_A-B at the time $t_1$, and accordingly the detection signal ST_A-B is switched to the high level.

In one or more embodiments, when the detection signal ST_A-B is switched to the high level, the NMOS transistor MN5 of the dynamic OR circuitry 22 is turned on and thereby the dynamic node D is pulled down to the low level. In one or more embodiments, the recovered clock signal RCLK is asserted and pulled up to the high level by the inverter IV3, in response to the pull-down of the dynamic node D.

In one or more embodiments, the variable delay circuitry 24 asserts the precharge signal $S_{PC}$ when the delay time Mask_delay lapses after the recovered clock signal RCLK is asserted. In one or more embodiments, the PMOS transistor MP1 precharges the dynamic node D to the power supply potential VDD when the precharge signal $S_{PC}$ is asserted.

In one or more embodiments, when the dynamic node D is precharged to the power supply potential VDD, the recovered clock signal RCLK is deasserted and pulled down to the low level by the inverter IV3.

As thus described, the recovered clock signal RCLK is asserted in synchronization with the timing at which the single ended signal T_A-B is flipped, and then deasserted after the predetermined delay time Mask_delay lapses, in one or more embodiments. This operation achieves generation of a clock pulse of the recovered clock signal RCLK in synchronization with the timing at which the single ended signal T_A-B is flipped, in one or more embodiments.

In one or more embodiments, the signal transition detectors $21_1$, $21_2$, and $21_3$ are placed into a state to set the detection signals ST_A-B, ST_B-C, and ST_C-A to the low level in the meantime.

In one or more embodiments, the signal transition detector $21_1$ is placed into a state to output the complementary single ended signal B_A-B as the detection signal ST_A-B, while the recovered clock signal RCLK is being pulled up to the high level. In one or more embodiments, when the recovered clock signal RCLK is asserted in a state in which the single ended signal T_A-B is the high level and the complementary single ended signal B_A-B is the low level, the NMOS transistors MN3 and MN4 are turned on to electrically connect the node $N_{LT}$ to the circuit ground, pulling down the node $N_{LT}$ to the low level. In one or more embodiments, when the node $N_{LT}$ is pulled down to the low level, the node $N_{LB}$ is pulled up to the high level by the inverter IV2. In one or more embodiments, the binary latch 25 is thereby placed into a state in which the complementary single ended signal B_A-B, which has been set to the low level, is selected as the detection signal ST_A-B. In one or more embodiments, this results in that the signal transition detector $21_1$ is placed into a state in which the signal transition detector $21_1$ outputs the low level as the detection signal ST_A-B.

In one or more embodiments, the signal transition detector $21_2$ has been already placed in a state to output the single ended signal T_B-C, which has been set to the low level, as the detection signal ST_B-C, and the state of the single ended signal T_B-C remains unchanged after the changes in the states of the wires A, B, and C. In such an embodiment, the state of the signal transition detector $21_2$ remains unchanged.

In one or more embodiments, with respect to the signal transition detector $21_3$, the single ended signal T_C-A is pulled down to the low level at the time $t_2$, and the complementary single ended signal B_C-A is accordingly pulled up to the high level. In one or more embodiments, the detection signal ST_C-A outputted from signal transition detector $21_3$ is pulled up to the high level at the time $t_2$, since the complementary single ended signal B_C-A is selected as the detection signal ST_C-A.

In one or more embodiments, when the recovered clock signal RCLK is then asserted, the signal transition detector $21_3$ is placed into a state to output the single ended signal T_C-A, which has been set to the low level, as the detection signal ST_C-A. In one or more embodiments, when the recovered clock signal RCLK is asserted in a state in which the single ended signal T_C-A is the low level and the complementary single ended signal B_C-A is the high level, the NMOS transistors MN1 and MN2 are turned on to electrically connect the node $N_{LB}$ to the circuit ground, pulling down the node $N_{LB}$ to the low level. In one or more embodiments, when the node $N_{LB}$ is pulled down to the low level, the node $N_{LT}$ is pulled up to the high level by the inverter IV1, and thereby the binary latch 25 is placed into a state in which the single ended signal T_C-A, which has been set to the low level, is selected as the detection signal ST_C-A. In one or more embodiments, this results in that the signal transition detector $21_3$ is placed into a state in which the signal transition detector $21_3$ outputs the low level as the detection signal ST_C-A.

In one or more embodiments, the operation to switch the states of the signal transition detectors $21_1$, $21_2$, and $21_3$ so that the detection signals ST_A-B, ST_B-C, and ST_C-A are set to the low level is completed before the dynamic node D is precharged to the high level. In one or more embodiments, even when any of the detection signals ST_B-C and ST_C-A are temporarily set to the high level while the dynamic node D is set to the low level, this causes a reduced influence or ideally no influence on the waveform of the recovered clock signal RCLK. In one or more embodiments, although the detection signal ST_C-A is temporarily set to the high level while the dynamic node D is set to the low level as illustrated in FIG. 4, this causes a reduced influence or ideally no influence on the waveform of the recovered clock signal RCLK.

Although the operation of the clock recovery circuitry 14 has been described in the above with respect to one example combination of the potentials $V_A$, $V_B$, and $V_C$ on the wires A, B, and C, a person skilled in the art would appreciate that the recovered clock signal RCLK can be generated through a similar operation for different combinations of the potentials $V_A$, $V_B$, and $V_C$ on the wires A, B, and C.

In one or more embodiments, the clock recovery circuitry 14 illustrated in FIG. 3 rapidly generates a clock pulse of the recovered clock signal RCLK after the states of the wires A, B, and C are switched. In the clock recovery circuitry 14 illustrated in FIG. 3, there are a reduced number of circuit elements along a critical path of the generation of the recovered clock signal RCLK. In one or more embodiments, the critical path comprises paths from the inputs of the signal transition detectors $21_1$, $21_2$, and $21_3$ to the output terminal 26. In one or more embodiments, the clock recovery circuitry 14 stably operates when the delay time Mask_delay is reduced, since the signal transition detectors $21_1$, $21_2$, and $21_3$ are placed into the state to output the low level in response to the assertion or pull-up of the recovered clock signal RCLK to the high level. These features of the clock recovery circuitry 14 may contribute to high-speed operation, in one or more embodiments. The reduction in the number of the circuit elements may be also advantageous for reductions in the area of the clock recovery circuitry 14 and in the power consumption. The circuit configuration which allows reduction in the delay time Mask_delay may facilitate the design of the clock recovery circuitry 14.

In one or more embodiments, the clock recovery circuitry 14 illustrated in FIG. 3 may offer improved operation stability. In one or more embodiments, the clock recovery circuitry 14 illustrated in FIG. 3 is configured to surely place the signal transition detectors $21_1$, $21_2$, and $21_3$ into stable states based on a feedback of the recovered clock signal RCLK. The improved operation stability of the clock recovery circuitry 14 illustrated in FIG. 3 may contribute to improved process portability.

Figure 5:
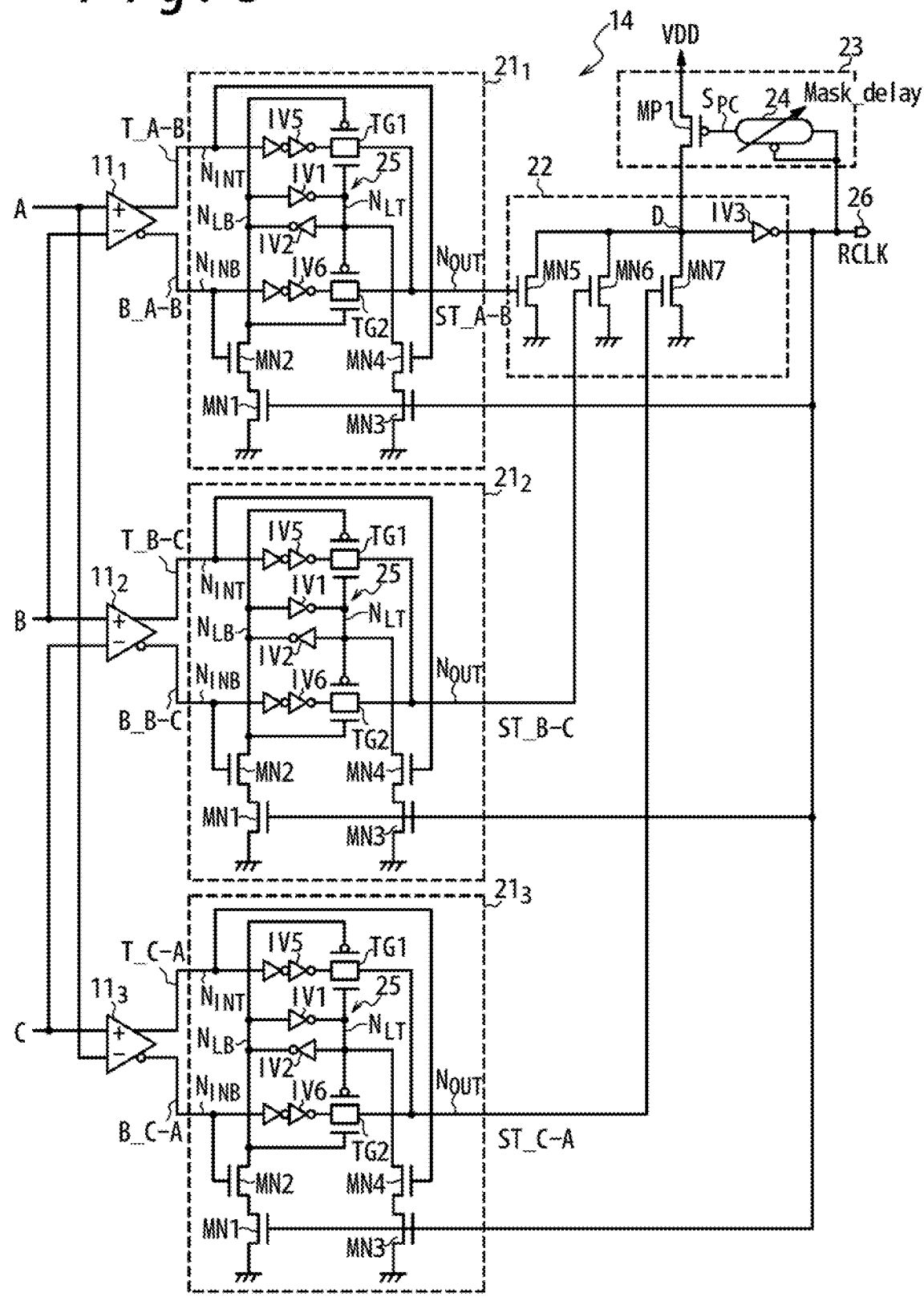
FIG. 5 is a circuit diagram illustrating a configuration of clock recovery circuitry, according to one or more embodiments.

In one or more embodiments, as illustrated in FIG. 5, the signal transition detectors $21_1$, $21_2$, and $21_3$ each comprise serially-connected inverters IV5 and IV6. In one or more embodiments, in each of the signal transition detectors $21_1$, $21_2$, and $21_3$, the serially-connected inverters IV5 are connected between the input node $N_{INT}$ and the transmission gate TG1, and the serially-connected inverters IV6 are connected between the input node $N_{INB}$ and the transmission gate TG2. In one or more embodiments, the numbers of the serially-connected inverters IV5 and IV6 are the same. In one or more embodiments, the numbers of the serially-connected inverters IV5 and IV6 are both two, but not limited to this. In one or more embodiments, the numbers of the serially-connected inverters IV5 and IV6 may be a positive even number.

In one or more embodiments, the serially-connected inverters IV5 and IV6 operate as delay elements configured to, when any of the single ended signals and the complementary single ended signals supplied to the signal transition detectors $21_1$, $21_2$, and $21_3$ are flipped, transmit the flipping of the signal ended signals and the complementary single ended signals to the transmission gates TG1 and TG2 after the states of the binary latches 25 of the signal transition detectors $21_1$, $21_2$, and $21_3$ are flipped in response to the assertion of the recovered clock signal RCLK. In one or more embodiments, this operation effectively prevents a detection signal outputted from a signal transition detector 21 from being temporarily flipped to the high level, the signal transition detector 21 receiving a single ended signal for which the time when the single ended signal is flipped is not the earliest.

For example, as is understood from FIG. 4, the detection signal ST_C-A may be temporarily set to the high level in the configuration illustrated in FIG. 3, although the single ended signal T_C-A is flipped after the single ended signal T_A-B is flipped. In the configuration illustrated in FIG. 5, in which the serially-connected inverters IV5 and IV6 are provided, the flipping of the single ended signal T_C-A and the complementary single ended signal B_C-A is transmitted to the transmission gates TG1 and TG2 of the signal transition detector $21_3$, after the binary latch 25 of the same is placed into a state to select the single ended signal T_C-A, which has been flipped to the low level, as the detection signal ST_C-A, in one or more embodiments. In one or more embodiments, this effectively prevents the detection signal ST_C-A from being temporarily set to the high level.

Figure 6:
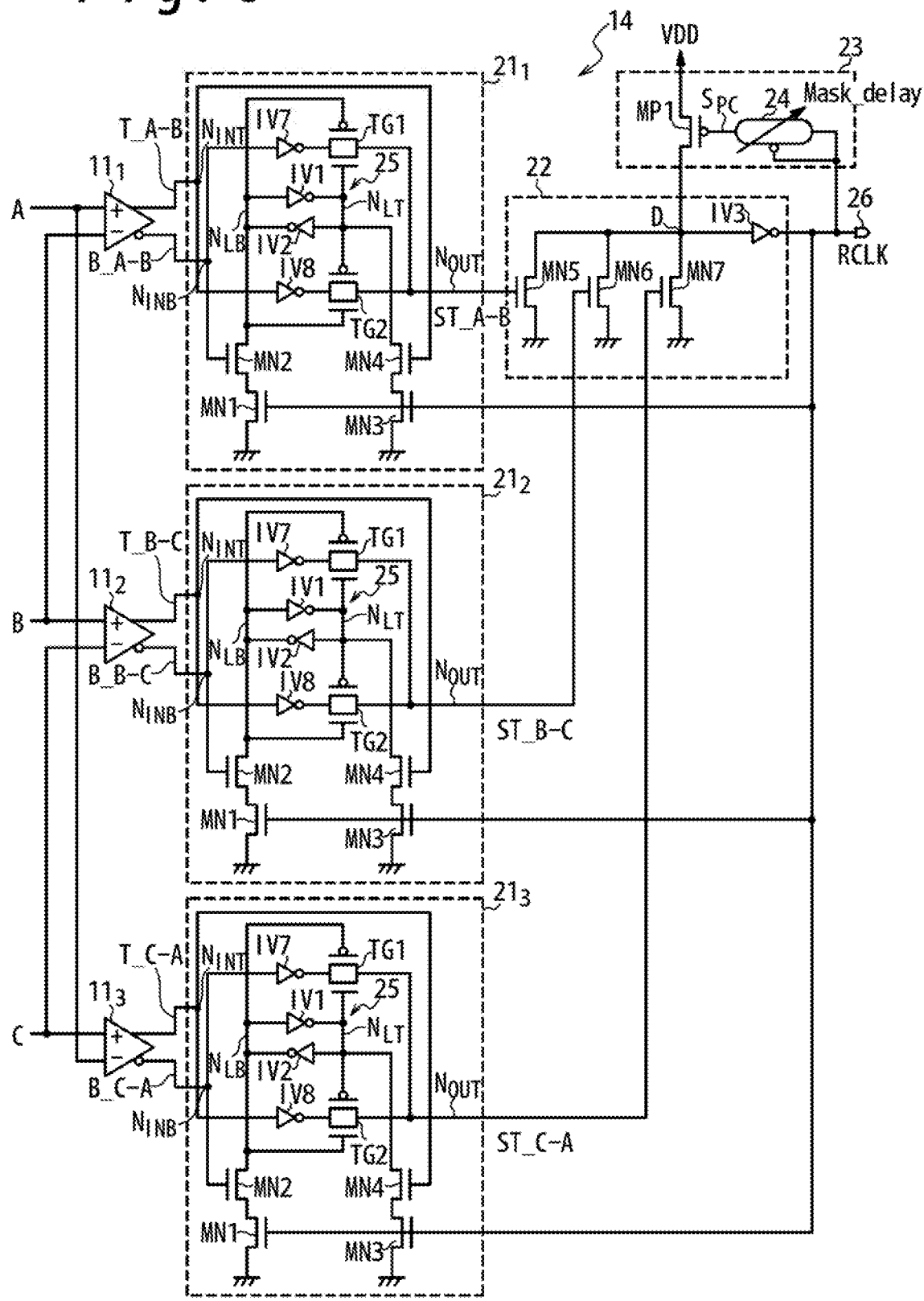
FIG. 6 is a circuit diagram illustrating a configuration of clock recovery circuitry, according to one or more embodiments.

In one or more embodiments, as illustrated in FIG. 6, the signal transition detectors $21_1$, $21_2$, and $21_3$ each comprise inverters IV7 and IV8. In one or more embodiments, similarly to the serially-connected inverters IV5 and IV6 illustrated in FIG. 5, the inverters IV7 and IV8 operate as delay elements configured to prevent a detection signal outputted from a signal transition detector 21 from being temporarily flipped to the high level, the signal transition detector 21 receiving a single ended signal with respect to which the time when the single ended signal is flipped is not the earliest.

In one or more embodiments, to keep the logical consistency, the connections between the input nodes $N_{INT}$, $N_{INB}$ and the transmission gates TG1 and TG2 are modified. In one or more embodiments, the input node $N_{INB}$ is connected to the transmission gate TG1 via the inverter IV7, and the input node $N_{INT}$ is connected to the transmission gate TG2 via the inverter IV8.

In one or more embodiments, the configuration illustrated in FIG. 6, which may offer a similar advantage to the configuration illustrated in FIG. 5, reduces the number of inverters connected between the input nodes $N_{INT}$, $N_{INB}$ and the transmission gate TG1 and TG2, compared with the configuration illustrated in FIG. 5.

In alternative embodiments, an odd number of inverters IV7 may be connected between the input node $N_{INB}$ and the transmission gate TG1, and an odd number of inverters IV8 may be connected between the input node $N_{INT}$ and the transmission gate TG2. In such an embodiment, the number of the inverters IV7 may be the same as that of the inverters IV8.

Figure 7:
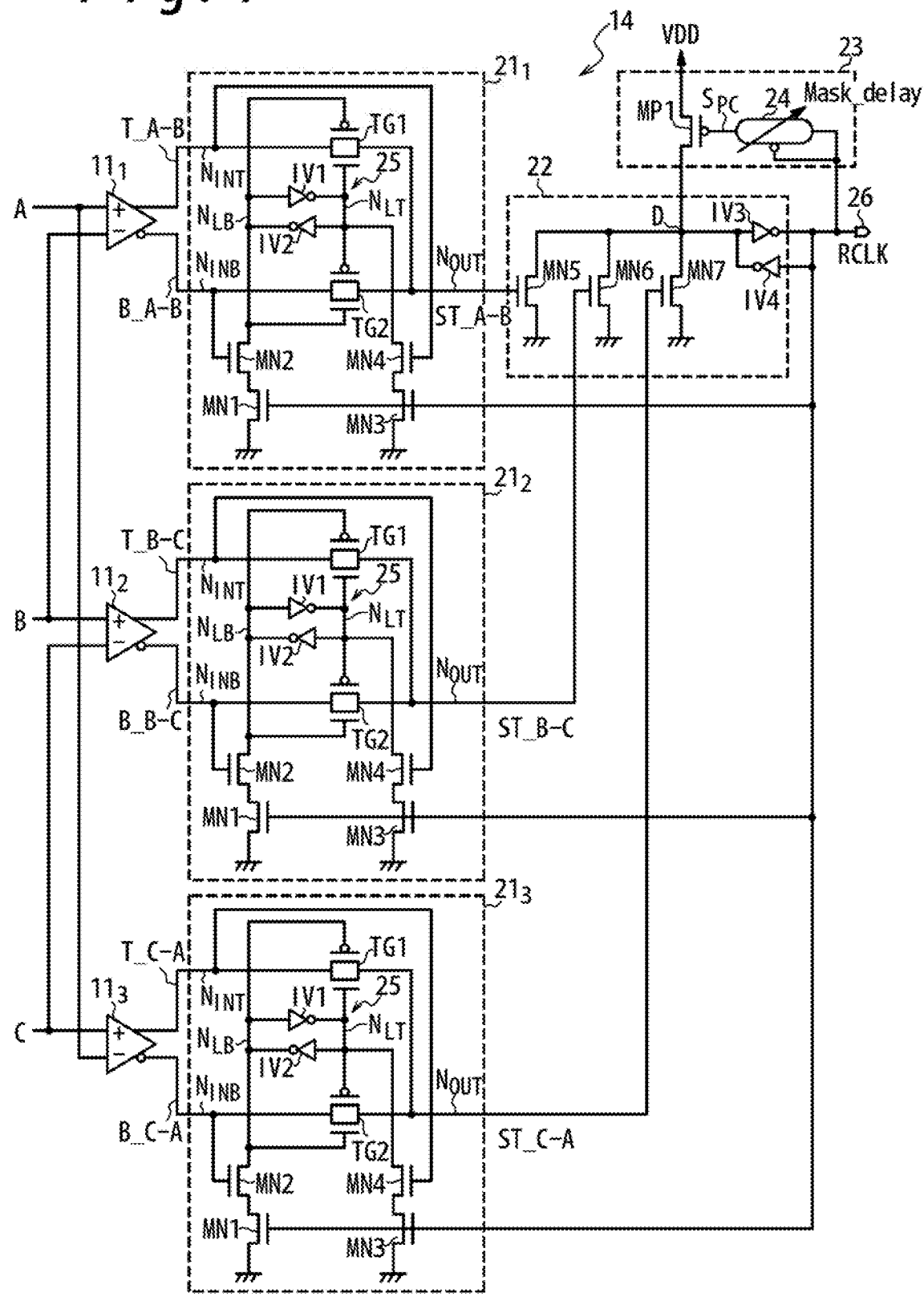
FIG. 7 is a circuit diagram illustrating a configuration of clock recovery circuitry, according to one or more embodiments.

In one or more embodiments, as illustrated in FIG. 7, the dynamic OR circuitry 22 further comprises an inverter IV4. In one or more embodiments, the rest of the clock recovery circuitry 14 is configured similarly to the configuration illustrated in FIG. 3.

In one or more embodiments, the inverter IV4 suppresses variations in the potential on the dynamic node D during a period in which the dynamic node D is not driven by any of the NMOS transistors MN5 to 7 or the precharge circuitry 23. In the configuration illustrated in FIG. 3, the potential on the dynamic node D may vary due to leak currents through the NMOS transistors MN5 to MN7 and the PMOS transistor MP1, during a period in which the dynamic node D is not driven, in one or more embodiments. In one or more embodiments, the configuration illustrated in FIG. 7, in which the inverter IV4 is provided, effectively suppresses variations in the potential on the dynamic node D.

In one or more embodiments, so as not to hinder the discharge of the dynamic node D, the inverter IV4 is configured so that the drive capacity to pull up the dynamic node D to the high level, for example, to the power supply potential VDD is sufficiently smaller than the drive capacity for each of the NMOS transistors MN5 to MN7 to pull down the dynamic node D to the low level. In one or more embodiments, so as not to hinder the precharge of the dynamic node D, the inverter IV4 is further configured so that the drive capacity to pull down the dynamic node D to the low level, for example, to the circuit ground potential is sufficiently smaller than the drive capacity for the PMOS transistor MP1 to pull up the dynamic node D to the high level.

Figure 8:
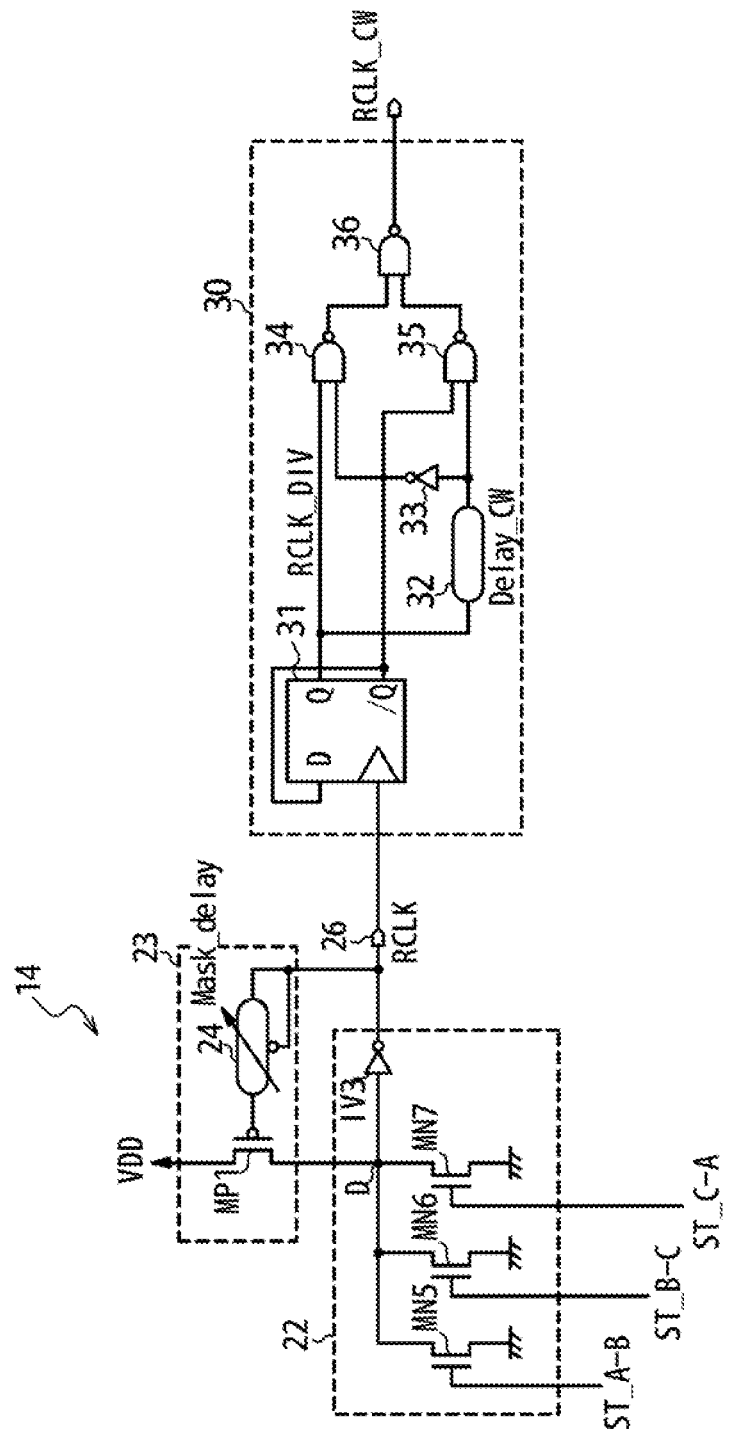
FIG. 8 is a circuit diagram illustrating a configuration of clock pulse expanding circuitry, according to one or more embodiments.

The clock recovery circuitry 14 described above may effectively achieve high-speed operation by setting a short delay time Mask_delay to the variable delay circuitry 24, in one or more embodiments. In one or more embodiments, as illustrated in FIG. 8, clock pulse expanding circuitry 30 may be connected to the output terminal 26 which outputs a recovered clock signal RCLK having an expanded clock pulse width.

In one or more embodiments, the clock pulse expanding circuitry 30 comprises a D flipflop 31, delay circuitry 32, an inverter 33, and NAND gates 34, 35, and 36. In one or more embodiments, the D flipflop 31 comprises a clock terminal connected to the output terminal 26 of the clock recovery circuitry 14, and a data input D connected to an inverting data output/Q thereof. In one or more embodiments, this connection results in that a frequency-divided clock signal RCLK_DIV obtained through frequency dividing of the recovered clock signal RCLK is outputted from a data output Q of the D flipflop 31, as illustrated in FIG. 9.

Referring back to FIG. 8, in one or more embodiments, the delay circuitry 32 is configured to receive the frequency-divided clock signal RCLK_DIV from the data output Q of the D flipflop 31 and output an output signal by delaying the frequency-divided clock signal RCLK_DIV.

In one or more embodiments, the NAND gate 34 comprises a first input connected to the data output Q of the D flipflop 31 and a second input connected to the output of the delay circuitry 32 via the inverter 33. In one or more embodiments, the NAND gate 35 comprises a first input connected to the complementary data output/Q of the D flipflop 31 and a second input connected to the output of the delay circuitry 32. In one or more embodiments, the NAND gate 36 comprises a first input connected to the output of the NAND gate 34 and a second input connected to the output of the NAND gate 35. In one or more embodiments, the NAND gate 36 outputs a clock signal RCLK_CW.

In one or more embodiments, the clock pulse expanding circuitry 30 is configured to generate the clock signal RCLK_CW so that the clock signal RCLK_CW comprises a clock pulse which is synchronous with a clock pulse of the recovered clock signal RCLK and has a pulse width of Delay_CW, as illustrated in FIG. 9. In one or more embodiments, the pulse width of the clock signal RCLK_CW is adjustable to a desired pulse width by properly setting the delay time Delay_CW of the delay circuitry 32.

Figure 10A:
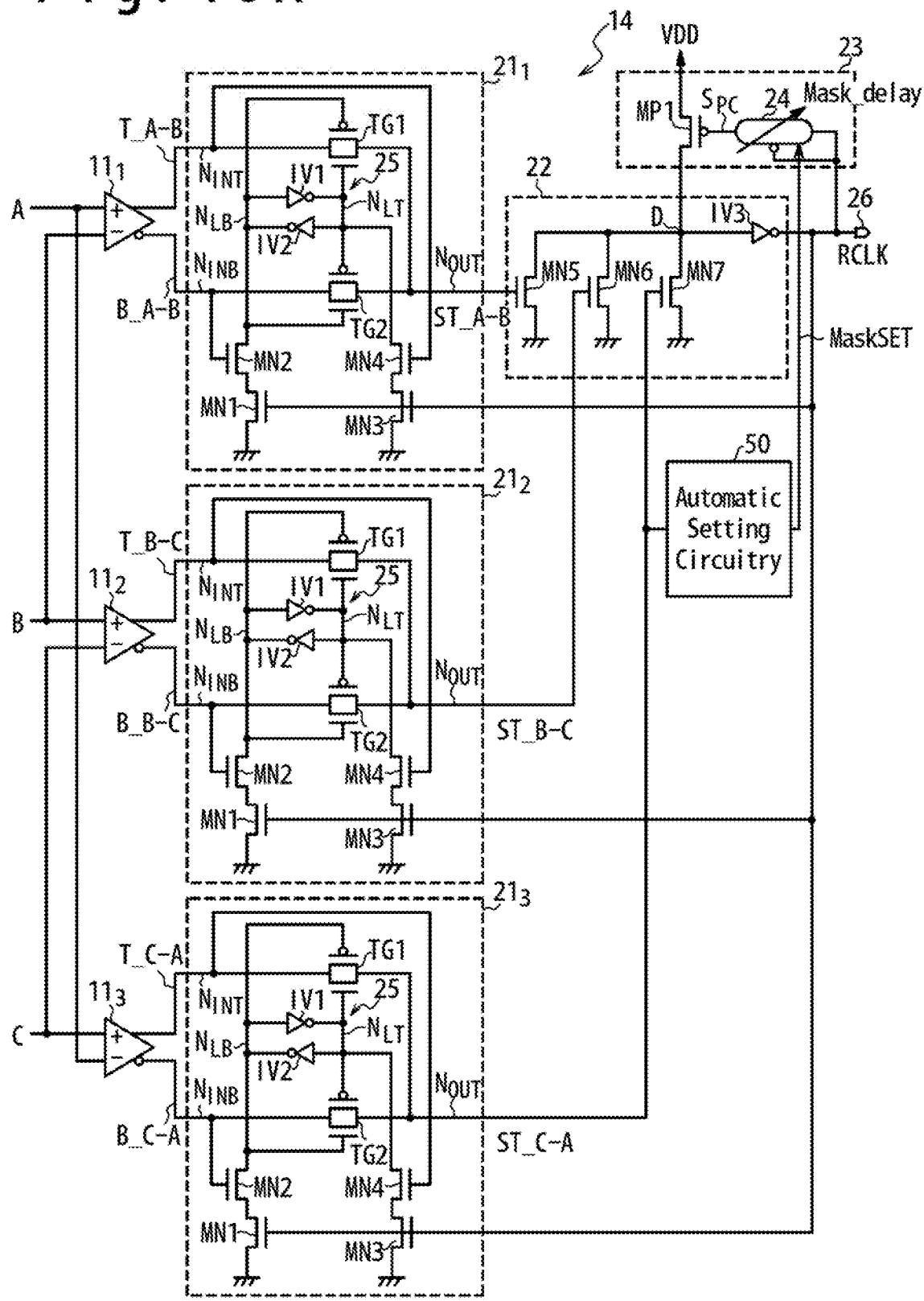
FIG. 10A is a circuit diagram illustrating a configuration of clock recovery circuitry, according to one or more embodiments.

In one or more embodiments, as illustrated in FIG. 10A, the clock recovery circuitry 14 comprises automatic setting circuitry 50 configured to automatically set the delay time Mask_delay of the variable delay circuitry 24 of the precharge circuitry 23. In one or more embodiments, the automatic setting circuitry 50 is configured to automatically generate a setting value MaskSET to adjust the delay time Mask_delay of the variable delay circuitry 24. In one or more embodiments, the automatic setting circuitry 50 is configured to automatically generate the setting value MaskSET so that the delay time Mask_delay is set to UI/2 or a delay time close to UI/2. In one or more embodiments, the setting value MaskSET thus generated properly controls the timing of assertion of the recovered clock signal RCLK, allowing the data latches $13_1$ to $13_3$ to latch the single ended signals T_A-B, T_B-C, and T_C-A at timing at or near the centers of the eye patterns. In one or more embodiments, this effectively improves data transfer reliability. The automatic generation of the setting value MaskSET to adjust the delay time Mask_delay to UI/2 or a delay time close to UI/2 is also advantageous in that the setting value MaskSET can be properly set for any allowed data transfer rates of the data transfer system 100.

In one or more embodiments, the automatic setting circuitry 50 is configured to properly generate the setting value MaskSET by using a training pattern transmitted to the receiver circuitry 2 when the data transfer system 100 starts a data transfer. In such an embodiment, the automatic setting circuitry 50 may be configured to, when the training pattern is inputted to the receiver circuitry 2, generate a signal having a periodicity of a predetermined times of the time duration of a UI, based on at least one of the detection signals ST_A-B, ST_B-C, and ST_C-A outputted from the signal transition detectors $21_1$, $21_2$, and $21_3$ and properly generate the setting value MaskSET based on the signal thus generated. FIG. 10A illustrates the automatic setting circuitry 50 configured to generate the setting value MaskSET based on the detection signal ST_C-A.

Figure 10B:
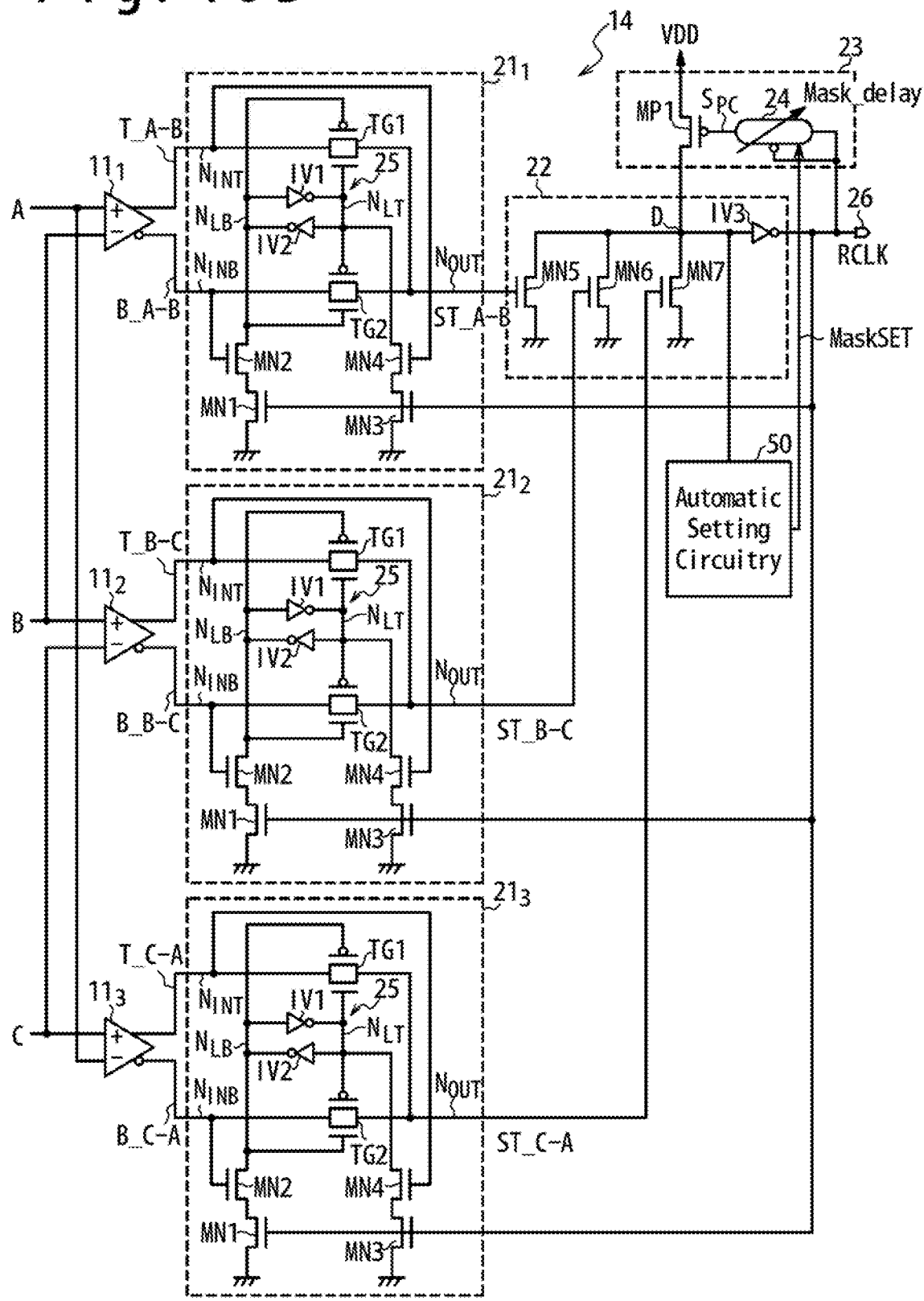
FIG. 10B is a circuit diagram illustrating a configuration of clock recovery circuitry, according to one or more embodiments.
Figure 10C:
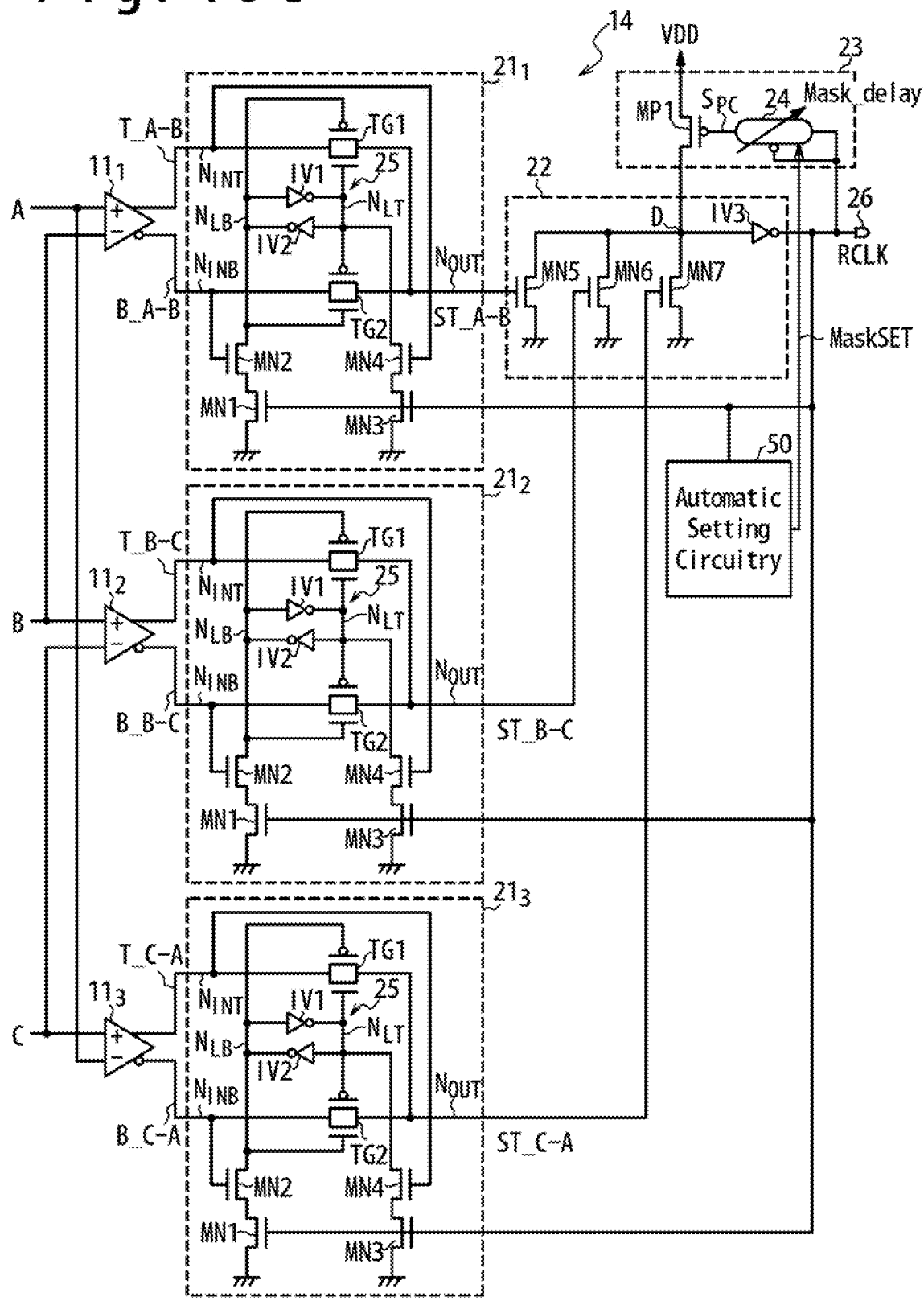
FIG. 10C is a circuit diagram illustrating a configuration of clock recovery circuitry, according to one or more embodiments.

In one or more embodiments, as illustrated in FIG. 10B, the automatic setting circuitry 50 may be configured to properly generate the setting value MaskSET based on a signal generated on the dynamic node D. In one or more embodiments, the signal generated on the dynamic node D is inputted to the inverter IV3. In one or more embodiments, as illustrated in FIG. 10C, the automatic setting circuitry 50 may be configured to properly generate the setting value MaskSET based on the recovered clock signal RCLK outputted from the clock recovery circuitry 14. In one or more embodiments, the recovered clock signal RCLK is outputted from the inverter IV3. The configurations illustrated in FIGS. 10B and 10C may be understood as variations of the configuration illustrated in FIG. 10A, since the signal generated on the dynamic node D and the recovered clock signal RCLK are both generated based on the detection signals ST_A-B, ST_B-C, and ST_C-A.

Figure 11:
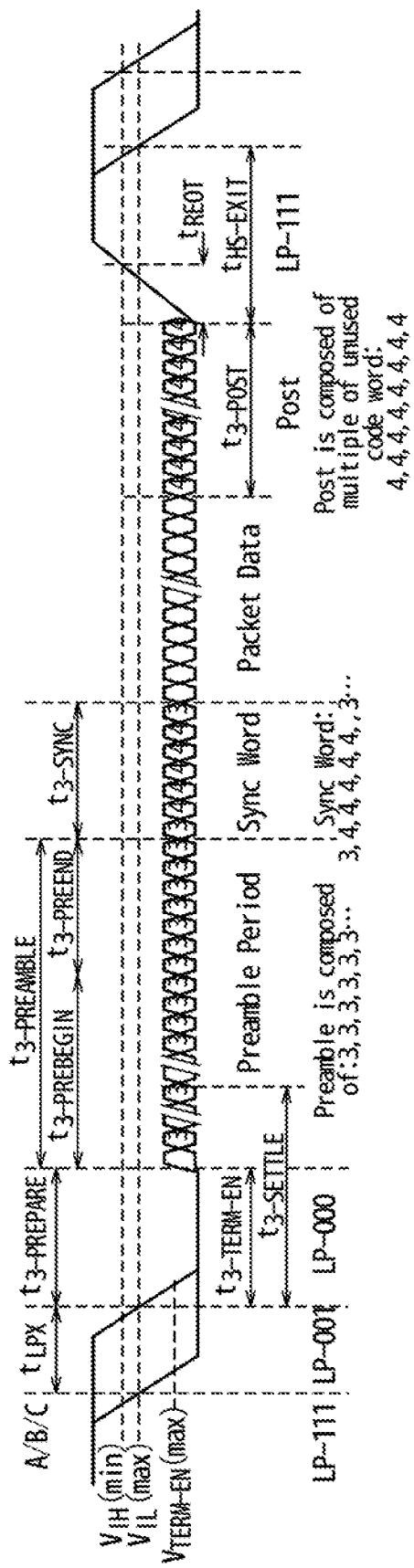
FIG. 11 is a timing chart illustrating one example data transfer in accordance with the mobile industry processor interface (MIPI) C-PHY standard, according to one or more embodiments.

When one of the clock recovery circuitries 14 illustrated in FIG. 10A to 10C is used in the receiver circuitry 2 of the data transfer system 100 operating in accordance with the MIPI C-PHY standard, in one or more embodiments, the automatic setting circuitry 50 may be configured to generate the setting value MaskSET using a training pattern transmitted from the transmitter circuitry 1 to the receiver circuitry 2. In one or more embodiments, as illustrated in FIG. 11, the transmitter circuitry 1 may be configured to successively transmit data "3" to the receiver circuitry 2 during a preamble period, when the data transfer system 100 is placed into a high speed (HS) mode in a data transfer in accordance with the MIPI C-PHY standard. In one or more embodiments, the data "3" successively transmitted in the preamble period may be used as a training pattern. Since a data "3" always flips only one of the detection signals ST_A-B, ST_B-C, and ST_C-A, the detection signals ST_A-B, ST_B-C, and ST_C-A and resultant signals generated from these signals, including the signal generated on the dynamic node D and the recovered clock signal RCLK, are periodic signals having a periodicity of an integer multiple of the time duration of a UI, when the detection signals ST_A-B, ST_B-C, and ST_C-A are generated based on the successively transmitted data "3". In one or more embodiments, the automatic setting circuitry 50 is configured to generate the setting value MaskSET based on the time duration of a UI in the preamble period, based on any of the detection signals ST_A-B, ST_B-C, ST_C-A, and resultant signals generated based on these signals. As described above, the setting value MaskSET may be generated so that the delay time Mask_delay is set to UI/2 or a delay time close to UI/2.

Figure 12:
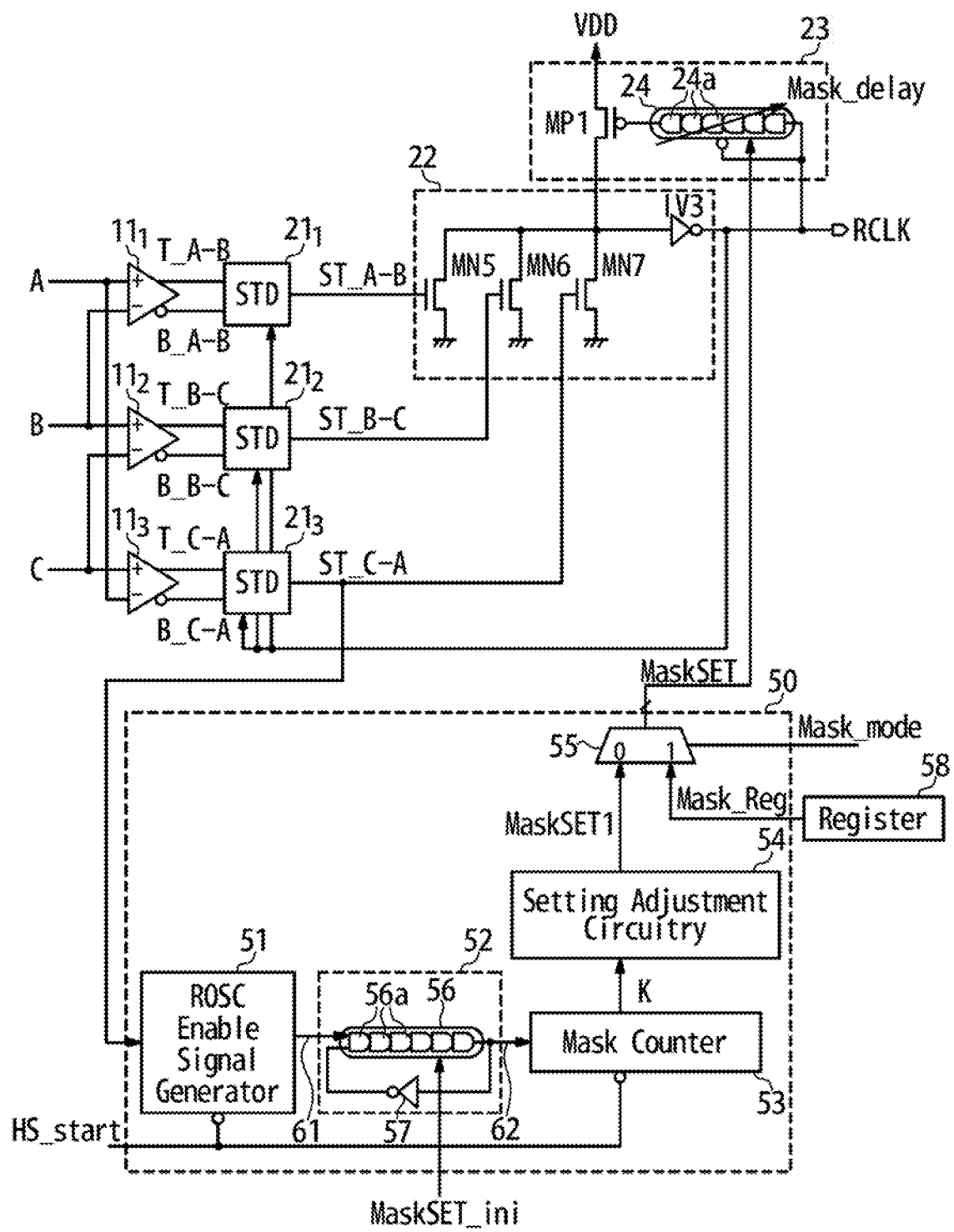
FIG. 12 is a circuit diagram illustrating a configuration of automatic setting circuitry, according to one or more embodiments.

In one or more embodiments, as illustrated in FIG. 12, the variable delay circuitry 24 comprises a sufficient number of unit delay elements 24a, and is configured to delay the recovered clock signal RCLK by using one or more of the unit delay elements 24a, the number of the used unit delay elements 24a being specified by the setting value MaskSET received from the automatic setting circuitry 50. In one or more embodiments, the variable delay circuitry 24 is configured to delay the recovered clock signal RCLK by using m unit delay elements 24a, when the setting value MaskSET is m. In this case, the delay time Mask_delay of the variable delay circuitry 24 is set to m×$T_D$, where $T_D$ is the delay time of each unit delay element 24a, in one or more embodiments.

In one or more embodiments, the automatic setting circuitry 50 comprises ring oscillator (ROSC) enable signal generator circuitry 51, an ROSC 52, a mask counter 53, setting adjustment circuitry 54, and a selector 55.

In one or more embodiments, the ROSC enable signal generator circuitry 51 is configured to receive at least one of the detection signals ST_A-B, ST_B-C, ST_C-A, the signal generated on the dynamic node D, and the recovered clock signal RCLK and generate an ROSC enable signal 61 based on the received signal. FIG. 12 illustrates the configuration in which the ROSC enable signal generator circuitry 51 receives the detection signal ST_C-A. In one or more embodiments, the ROSC enable signal 61 comprises a pulse generated in synchronization with an assertion of the signal received by the ROSC enable signal generator circuitry 51.

In one or more embodiments, the ROSC enable signal generator circuitry 51 is configured to generate the ROSC enable signal 61 by performing frequency dividing on the signal received by the ROSC enable signal generator circuitry 51. In such an embodiment, the frequency dividing ratio $f_D$ of the ROSC enable signal generator circuitry 51 is set so that a pulse width of a pulse in the ROSC enable signal 61 is an integer multiple of a UI, that is, N times a UI, where N is a desired integer of two or more. In one or more embodiments, the pulse width is the time duration during which the ROSC enable signal 61 is asserted.

In one or more embodiments, the periodicities of the detection signals ST_A-B, ST_B-C, and ST_C-A are all 3×UI, when data "3" are successively transmitted to the receiver circuitry 2. In one or more embodiments, when the ROSC enable signal generator circuitry 51 receives one of the detection signals ST_A-B, ST_B-C, and ST_C-A, the pulse width of the ROSC enable signal 61 is 3×($f_D$/2)×UI. In one or more embodiments, the frequency dividing ration $f_D$ is accordingly set so that 3×($f_D$/2)×UI is N times a UI. In one or more embodiments, the frequency dividing ration $f_D$ is accordingly set to 2N/3. In one or more embodiments, a desired pulse width of the ROSC enable signal 61 is 12UI, and the frequency dividing ratio $f_D$ of the ROSC enable signal generator circuitry 51 is set to 8.

The periodicities of the signal generated on the dynamic node D and the recovered clock signal RCLK are both one UI, when data "3" are successively transmitted to the receiver circuitry 2. In one or more embodiments, when the ROSC enable signal generator circuitry 51 receives the signal generated on the dynamic node D or the recovered clock signal RCLK, the pulse width of the ROSC enable signal 61 is ($f_D$/2)×UI. In such an embodiment, the frequency dividing ratio $f_D$ is set so that $f_D$/2 is equal to N.

In one or more embodiments, the ROSC enable signal generator circuitry 51 is configured to receive an HS mode start signal HS_start and perform the frequency dividing operation while the HS mode start signal HS_start is asserted. In one or more embodiments, the HS mode start signal HS_start is asserted for a predetermined time duration after the receiver circuitry 2 detects that the data transfer system 100 is placed into the HS mode. In one or more embodiments, the ROSC enable signal generator circuitry 51 is configured to clear or reset the frequency dividing operation in response to a negation of the HS mode start signal HS_start.

In one or more embodiments, the ROSC 52 is configured to oscillate in response to the ROSC enable signal 61 to output an oscillation output signal 62. In one or more embodiments, the ROSC 52 is configured to oscillate while the ROSC enable signal 61 is asserted. In one or more embodiments, the ROSC 52 is not configured to oscillate while the ROSC enable signal 61 is deasserted.

In one or more embodiments, the ROSC 52 comprises a variable delay circuitry 56 and a feedback path 57. In one or more embodiments, the variable delay circuitry 56 comprises a first input receiving the ROSC enable signal 61 and a second input connected to an output of the variable delay circuitry 56 itself via the feedback path 57. In one or more embodiments, the variable delay circuitry 56 is configured to delay a signal supplied to the second input from the feedback path 57 to output the oscillation output signal 62 while the ROSC enable signal 61 is asserted. In one or more embodiments, the feedback path 57 is configured to feed back an inverted signal of the oscillation output signal 62 to the second input of the variable delay circuitry 56 to achieve the oscillation operation of the ROSC 52.

In one or more embodiments, the variable delay circuitry 56 is configured as a replica of the same configuration as the variable delay circuitry 24. In one or more embodiments, the variable delay circuitry 56 comprises a plurality of unit delay elements 56a. In one or more embodiments, the unit delay elements 56a are configured to have the same delay time as that of the unit delay elements 24a of the variable delay circuitry 24. In one or more embodiments, the unit delay elements 56a are configured as replicas of the same configuration as the unit delay elements 24a. In one or more embodiments, the variable delay circuitry 56 is configured so that the number M of unit delay elements 56a used for the oscillation operation is adjustable based on a setting value MaskSET_ini. In one or more embodiments, M unit delay elements 56a are connected in series when the ROSC 52 performs the oscillation operation, where M is specified by the setting value MaskSET_ini.

In one or more embodiments, the mask counter 53 performs a counting operation based on the oscillation output signal 62 outputted from the ROSC 52. In one or more embodiments, the mask counter 53 is configured to count the number of pulses in the oscillation output signal 62 outputted from the ROSC 52. In one or more embodiments, the mask counter 53 is configured to receive the HS mode start signal HS_start and reset a count value to zero in response to a negation of the HS mode start signal HS_start.

In one or more embodiments, the setting adjustment circuitry 54 is configured to generate a setting value MaskSET1 based on the count value of the mask counter 53. In one or more embodiments, the setting adjustment circuitry 54 is configured to set the setting value MaskSET1 to the same value as the count value of the mask counter 53. In one or more embodiments, the setting adjustment circuitry 54 is configured to set the setting value MaskSET1 to a value obtained by performing a predetermined operation, for example, an operation for minor adjustment, on the count value of the mask counter 53.

In one or more embodiments, the selector 55 is configured to select the setting value maskSET between the setting value MaskSET1 received from the setting adjustment circuitry 54 and a setting value Mask_Reg received from a register 58. In one or more embodiments, the selector 55 is configured to select the setting value MaskSET1 as the setting value MaskSET when a mask mode select signal Mask_mode is for example "0" and select the setting value Mask_Reg as the setting value MaskSET when the mask mode select signal Mask_mode is for example "1." In one or more embodiments, the setting value MaskSET is automatically set to the setting value MaskSET1 obtained from the training pattern by selecting the setting value MaskSET1 by the selector 55 based on the mask mode select signal Mask_mode. In one or more embodiments, the setting value MaskSET is set to the setting value Mask_Reg by selecting the setting value Mask_Reg by the selector 55 based on the mask mode select signal Mask_mode.

In one or more embodiments, the automatic setting circuitry 50 illustrated in FIG. 12 operates as follows. In one or more embodiments, the count value of the mask counter 53 is reset to zero in an initial state in which the HS mode start signal HS_start is negated. In one or more embodiments, when the setting value MaskSET is desired to be automatically set by the automatic setting circuitry 50, the mask mode select signal Mask_mode is set so that the selector 55 selects the setting value MaskSET1 generated by the setting adjustment circuitry 54. In such an embodiment, the setting value MaskSET to be supplied to the variable delay circuitry 24 is finally set to the setting value MaskSET1 generated by the setting adjustment circuitry 54. In one or more embodiments, the number M of unit delay elements 56a used for the oscillation operation in the ROSC 52 is further set to a desired number based on the setting value MaskSET_ini.

In one or more embodiments, when the data transfer system 100 is placed into the HS mode, the HS mode start signal HS_start is asserted, and data "3" are successively transmitted from the transmitter circuitry 1 to the receiver circuitry 2 in the preamble period. In one or more embodiments, the successively-transmitted data "3" are used as a training pattern. When the data "3" are successively transmitted, the detection signals ST_A-B, ST_B-C, and ST_C-A, the signal generated on the dynamic node D, and the recovered clock signal RCLK are all periodic signals of periodicities of integer multiples of a UI. In one or more embodiments, one of these signals is supplied to the ROSC enable signal generator circuitry 51.

In one or more embodiments, when the signal supplied to the ROSC enable signal generator circuitry 51 is asserted, the ROSC enable signal generator circuitry 51 outputs the ROSC enable signal 61 so that a pulse of a pulse width of N×UI appears in the ROSC enable signal 61; and thereby the ROSC enable signal 61 is asserted for a time duration of N×UI. In one or more embodiments, the ROSC 52 performs the oscillation operation to output the oscillator output signal 62 while the ROSC enable signal 61 is asserted.

In one or more embodiments, the mask counter 53 counts the number of pulses appearing in the oscillator output signal 62 of the ROSC 52. In one or more embodiments, when the pulse width of the ROSC enable signal 61 is N×UI and the delay time of the unit delay elements 56a of the variable delay circuitry 56, that is, the delay time of the unit delay elements 24a is $T_D$, the count value K of the mask counter 53 when the assertion of the ROSC enable signal 61 is completed is approximately represented by the following expression (1):

$$K \approx \frac{1}{2} \times \frac{N \cdot UI}{M \cdot T_D}. \qquad (1)$$

In one or more embodiments, the count value K of the mask counter 53 comprises information corresponding to UI/2, as is understood from expression (1). In one or more embodiments, the setting adjustment circuitry 54 determines the setting value MaskSET1, that is, the setting value MaskSET to be set to the variable delay circuitry 24 based on the count value K of the mask counter 53, so that the delay time Mask_delay of the variable delay circuitry 24 is set to UI/2 or a delay time close to UI/2.

In one or more embodiments, when the ROSC enable signal generator circuitry 51 outputs a pulse of a pulse width of N×UI in the ROSC enable signal 61, the number M of unit delay elements 56a specified by the MaskSET_ini is set to N. In one or more embodiments, when the ROSC enable signal generator circuitry 51 receives one of the detection signals ST_A-B, ST_B-C, and ST_C-A and the frequency dividing ratio $f_D$ is eight, N is 12. In such an embodiment, the number M of unit delay elements 56a specified by the setting value MaskSET_ini is accordingly set to 12. In one or more embodiments, when the number M of unit delay elements 56a specified by the setting value MaskSET_ini is equal to N, the following expression (2) approximately holds:

$$K \approx \frac{UI}{2} \Big/ T_D. \qquad (2)$$

In such an embodiment, the setting value MaskSET1, that is, the setting value MaskSET may be set to the count value K of the mask counter 53 without change. This operation achieves setting of the delay time Mask_delay of the variable delay circuitry 24 to UI/2 or a delay time close to UI/2, while allowing simplification of the configuration of the setting adjustment circuitry 54, in one or more embodiments. In one or more embodiments, when M is equal to N, the setting adjustment circuitry 54 generates the setting value MaskSET1, that is, the setting value MaskSET to be set to the variable delay circuitry 24, through minor adjustment of the count value K of the mask counter 53. In one or more embodiments, this operation achieves setting of the delay time Mask_delay of the variable delay circuitry 24 to a delay time close to but different from UI/2. In one or more embodiments, the delay time Mask_delay is made slightly different from UI/2 based on the state of the data transfer system 100 to reduce data errors.

In one or more embodiments, the automatic setting circuitry 50 illustrated in FIG. 12 may reduce influences of jitters on the detection signals ST_A-B, ST_B-C, and ST_C-A. In one or more embodiments, this may result from that the automatic setting circuitry 50 is configured to generate the ROSC enable signal 61 to have a pulse width of an integer multiple of one UI and generate the setting value MaskSET based on an averaged UI. In one or more embodiments, the automatic setting circuitry 50 may reduce process-voltage-temperature (PVT) variations. In one or more embodiments, the reduction may result from that the automatic setting circuitry 50 is configured to generate the setting value MaskSET reflecting the operation characteristics of the unit delay elements 56a in an actual operation environment.

Figure 13:
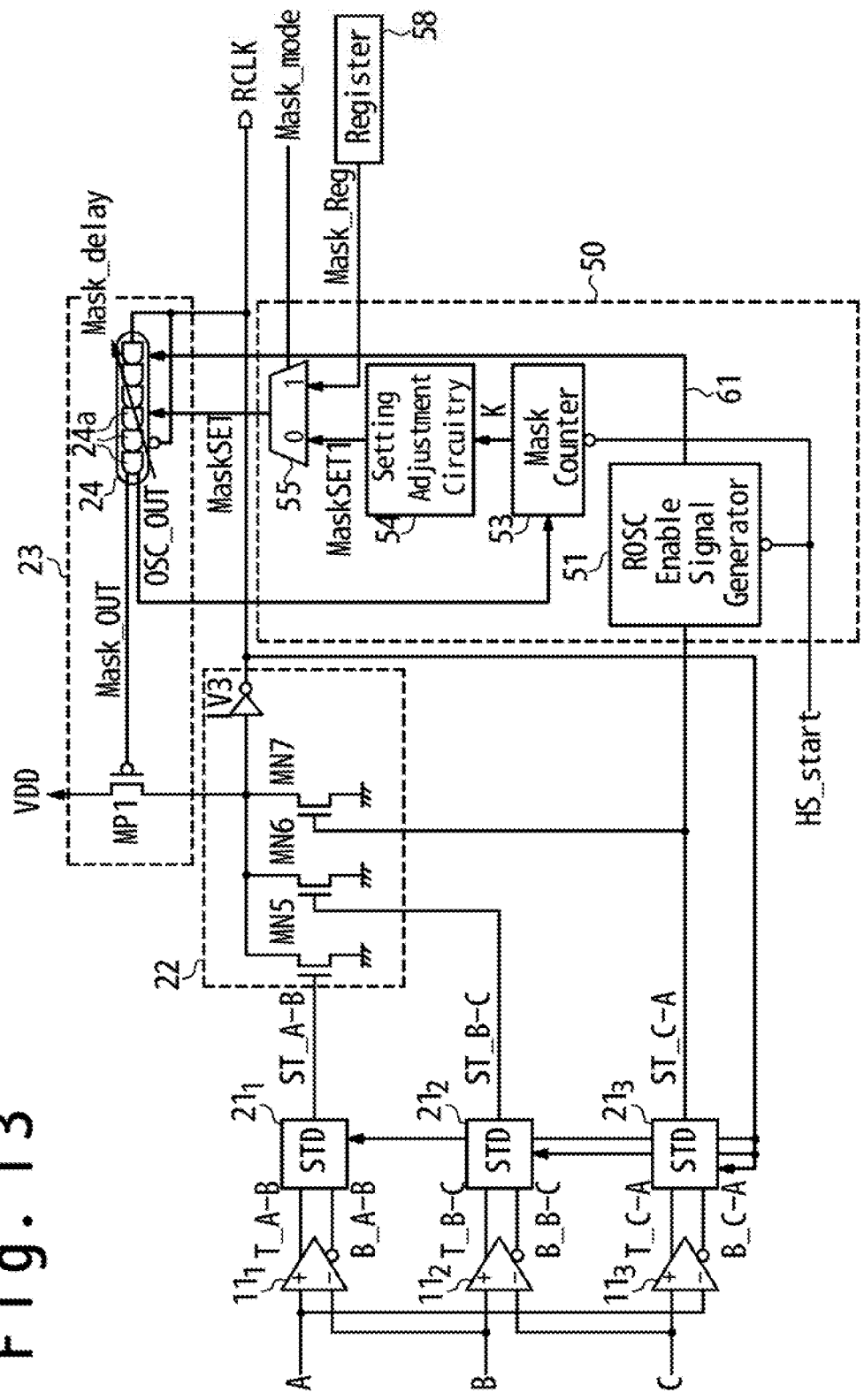
FIG. 13 is a circuit diagram illustrating a configuration of automatic setting circuitry, according to one or more embodiments.

In one or more embodiments, as illustrated in FIG. 13, the variable delay circuitry 24 is configured to operate also as an ROSC, and the ROSC 52 is removed from the automatic setting circuitry 50. In one or more embodiments, the variable delay circuitry 24 can be operated in two operation modes: a normal operation mode and an ROSC mode. In one or more embodiments, the variable delay circuitry 24 is placed in the ROSC mode when the automatic setting circuitry 50 generates the setting value MaskSET to be set to the variable delay circuitry 24.

In one or more embodiments, when placed in the normal operation mode, the variable delay circuitry 24 is configured to generate a delayed output signal Mask_OUT by delaying the recovered clock signal RCLK by using a number of unit delay elements 24a, the number of the used unit delay elements 24a being specified by the setting value MaskSET. In one or more embodiments, the delayed output signal Mask_OUT is supplied to the gate of the PMOS transistor MP1 to control the PMOS transistor MP1.

In one or more embodiments, when placed in the ROSC mode, the variable delay circuitry 24 operates as an ROSC performing an oscillating operation to output an oscillation output signal OSC_OUT. In one or more embodiments, the oscillating operation is achieved by serially connecting M unit delay elements 24a in the variable delay circuitry 24 and feeding back the output of the serially-connected unit delay elements 24a to the input thereof via a not-shown feedback path, where M is specified by the setting value MaskSET. In one or more embodiments, when placed in the ROSC mode, the variable delay circuitry 24 performs the oscillating operation while the ROSC enable signal 61 is asserted. In one or more embodiments, the variable delay circuitry 24 does not perform the oscillating operation while the ROSC enable signal 61 is deasserted.

In one or more embodiments, the variable delay circuitry 24 comprises a not-shown bypass path having a fixed delay time. In one or more embodiments, when placed in the ROSC mode, the variable delay circuitry 24 generates the delayed output signal Mask_OUT by delaying the recovered clock signal RCLK by using the bypass path. In one or more embodiments, when the variable delay circuitry 24 is placed in the ROSC mode, a training pattern, for example, a suite of successive data "3" is transmitted to the receiver circuitry 2. In such an embodiment, the delay time of the bypass path, that is, the delay time Mask_delay given to the recovered clock signal RCLK by the variable delay circuitry 24 in the ROSC mode may be arbitrarily set as long as the clock recovery circuitry 14 can properly operate.

In one or more embodiments, the automatic setting circuitry 50 illustrated in FIG. 13 operates as follows. In an initial state in which the HS mode start signal HS_start is negated, the count value K of the mask counter 53 is reset to zero. The setting value MaskSET supplied to the variable delay circuitry 24 is further set to specify a desired number M of unit delay elements 24a used when the variable delay circuitry 24 operates as an ROSC. In one or more embodiments, this may be achieved by allowing the selector 55 to select the setting value Mask_Reg by the mask mode select signal Mask_mode and setting the setting value Mask_Reg to M. In such an embodiment, this places the variable delay circuitry 24 into a state in which M unit delay elements 24a are used when the variable delay circuitry 24 operates as an ROSC to achieve an oscillating operation.

In one or more embodiments, the automatic setting circuitry 50 illustrated in FIG. 13 is configured to generate the setting value MaskSET1 through a similar operation to the automatic setting circuitry 50 illustrated in FIG. 12, except for that the variable delay circuitry 24 is operated as an ROSC instead of using the ROSC 52. In one or more embodiments, when the signal supplied to the ROSC enable signal generator circuitry 51 is asserted, the ROSC enable signal generator circuitry 51 outputs the ROSC enable signal 61 so that a pulse of a pulse width of N×UI appears in the ROSC enable signal 61; this results in that the ROSC enable signal 61 is asserted for a time duration of N×UI. In one or more embodiments, the variable delay circuitry 24 performs an oscillating operation to output the oscillation output signal OSC_OUT while the ROSC enable signal 61 is asserted.

In one or more embodiments, the mask counter 53 counts the number of pulses appearing in the oscillation output signal OSC_OUT. In one or more embodiments, the setting adjustment circuitry 54 generates the setting value MaskSET1 based on the count value K of the mask counter 53, so that the delay time Mask_delay of the variable delay circuitry 24 is set to UI/2 or a delay time close to UI/2.

In one or more embodiments, after the setting value MaskSET1 is generated, the mask mode select signal Mask_mode is set to allow the selector 55 to select the setting value MaskSET1. In one or more embodiments, the setting value MaskSET1 generated by the setting adjustment circuitry 54 is selected as the setting value MaskSET and set to the variable delay circuitry 24. In one or more embodiments, the variable delay circuitry 24 operates based on the setting value MaskSET thus set in the normal operation mode.

In one or more embodiments, the configuration illustrated in FIG. 13 does not require the ROSC 52 separately from the variable delay circuitry 24.

Figure 14:
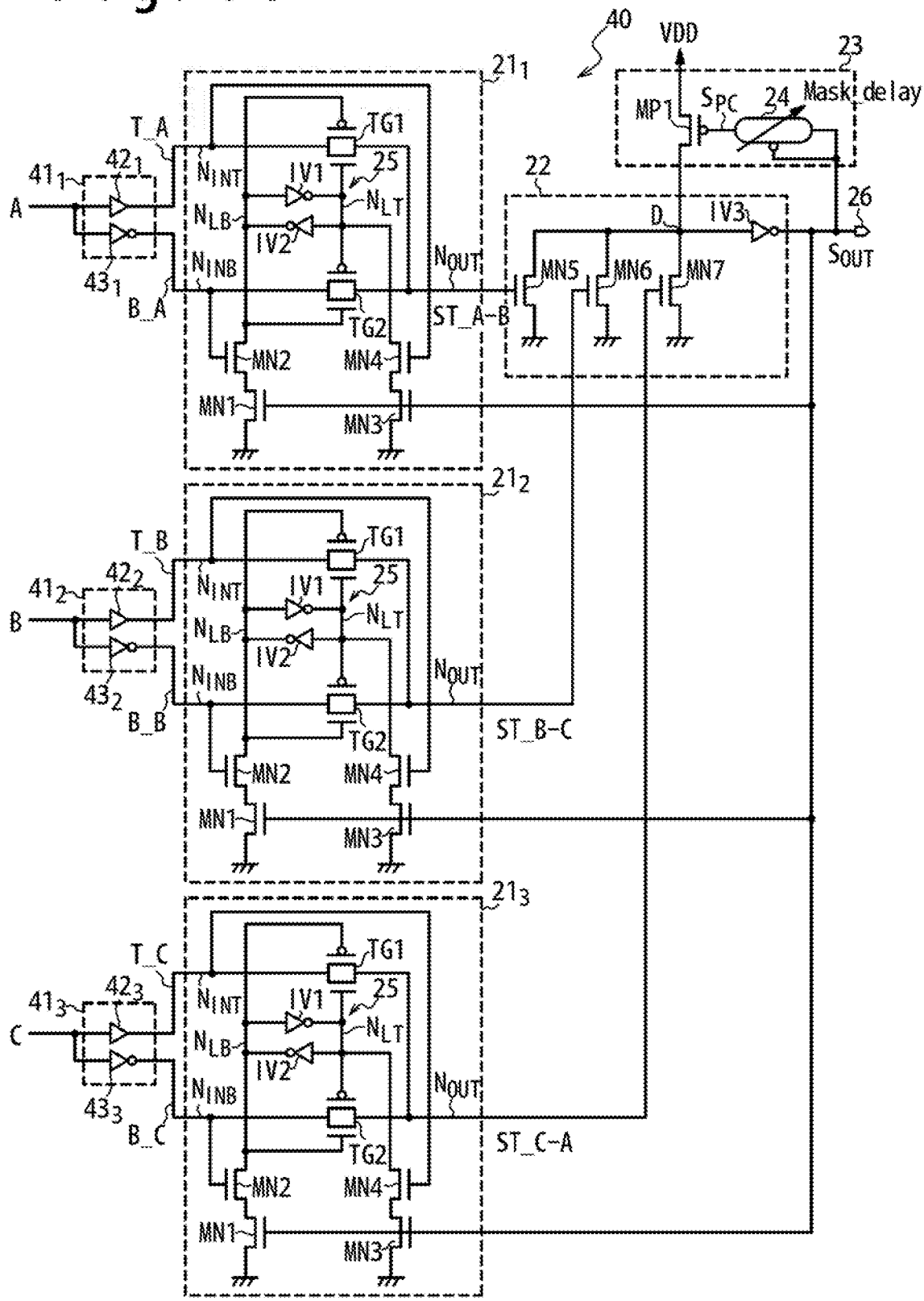
FIG. 14 is a circuit diagram illustrating a configuration of semiconductor circuitry, according to one or more embodiments.

In one or more embodiments, as illustrated in FIG. 14, semiconductor circuitry 40 is configured to detect state transitions of signals transmitted over the wires A, B, and C. In one or more embodiments, the semiconductor circuitry 40 is generally configured similarly to the clock recovery circuitry 14 illustrated in FIG. 3. In one or more embodiments, the semiconductor circuitry 40 comprises differential signal generator circuitries $41_1$, $41_2$, and $41_3$ connected to the wires A, B, and C, respectively.

In one or more embodiments, the differential signal generator circuitry $41_1$ comprises a buffer $42_1$ and an inverter $43_1$ and is configured to generate a single ended signal T_A and a complementary single ended signal B_A which correspond to a signal received from the wire A. In one or more embodiments, the single ended signal T_A and the complementary single ended signal B_A are complementary to each other. In one or more embodiments, the differential signal generator circuitry $41_2$ comprises a buffer $42_2$ and an inverter $43_2$ and is configured to generate a single ended signal T_B and a complementary single ended signal B_B which correspond to a signal received from the wire B. In one or more embodiments, the single ended signal T_B and the complementary single ended signal B_B are complementary to each other. In one or more embodiments, the differential signal generator circuitry $41_3$ comprises a buffer $42_3$ and an inverter $43_3$ and is configured to generate a single ended signal T_C and a complementary single ended signal B_C which correspond to a signal received from the wire C. In one or more embodiments, the single ended signal T_C and the complementary single ended signal B_C are complementary to each other.

In one or more embodiments, the semiconductor circuitry 40 illustrated in FIG. 14 operates similarly to the clock recovery circuitry 14 illustrated in FIG. 3, except for that the single ended signal T_A and the complementary single ended signal B_A are supplied to the signal transition detector $21_1$, the single ended signal T_B and the complementary single ended signal B_B are supplied to the signal transition detector $21_2$, and the single ended signal T_C and the complementary single ended signal B_C are supplied to the signal transition detector $21_3$. In one or more embodiments, when transitions of the signals transmitted over the wires A, B, and C successively occur in a period of a time duration of the delay time Mask_delay set to the variable delay circuitry 24, the semiconductor circuitry 40 is configured to assert the output signal $S_{OUT}$ outputted from the output terminal 26 in synchronization with the earliest one of the transitions.

Although various embodiments of the present disclosure have been specifically described in the above, a person skilled in the art would appreciate that the technologies described in this disclosure may be implemented with various modifications.

For example, PMOS transistors may be used in place of the NMOS transistors MN1 to MN4 of the signal transition detectors $21_1$, $21_2$, $21_3$ and the NMOS transistors MN5 to MN7 of the dynamic OR circuitry 22, and an NMOS transistor is used in place of the PMOS transistor MP1 of the precharge circuitry 23. In this case, the PMOS transistors corresponding to the NMOS transistors MN1 and MN2 are serially connected between the node $N_{LB}$ and the node of the power supply potential VDD, and the PMOS transistors corresponding to the NMOS transistors MN3 and MN4 are serially connected between the node $N_{LT}$ and the node of the power supply potential VDD, in one or more embodiments. In one or more embodiments, the PMOS transistors corresponding to the NMOS transistors MN5 to MN7 are connected in parallel between the dynamic node D and the node of the power supply potential VDD. In one or more embodiments, the NMOS transistor corresponding to the PMOS transistor MP1 is connected between the circuit ground and the dynamic node D. In such an embodiment, an inverter configured to invert the recovered clock signal RCLK may be provided.

In one or more embodiments, the use of the NMOS transistors MN1 to MN7 and the PMOS transistor MP1 as illustrated in FIGS. 3, 5 to 7, and 14 may enhance high speed operation.

In one embodiment, semiconductor circuitry comprises a plurality of signal transition detectors configured to respectively output detection signals based on a transition of at least one of a plurality of signals, and dynamic OR circuitry configured to output a recovered clock signal based on a logical sum of the detection signals.

In one embodiment, each of the plurality of signal transition detectors comprises a selector and state setting circuitry. The selector is configured to receive a first input signal and a second input signal generated based on at least one of the plurality of signals, and output one of the first input signal and the second input signal as a corresponding one of the detection signals. The first input signal and the second input signal are complementary to each other. Further, the state setting circuitry is configured to set a state of the selector based on the recovered clock signal, the first input signal, and the second input signal.

In one embodiment, the semiconductor circuitry further comprises a first differential receiver, a second differential receiver, and a third differential receiver. The first differential receiver comprises a first input connected to a first wire and a second input connected to a second wire and the first differential receiver is configured to supply the first input signal and the second input signal of a first signal transition detector of the plurality of signal transition detectors. The second differential receiver comprises a first input connected to the second wire and a second input connected to a third wire, and the second differential receiver is configured to supply the first input signal and the second input signal of a second signal transition detector of the plurality of signal transition detectors. The third differential receiver comprises a first input connected to the third wire and a second input connected to the first wire, and the third differential receiver is configured to supply the first input signal and the second input signal of a third signal transition detector of the plurality of signal transition detectors.

In one embodiment, the data signals transmitted over the first wire, the second wire, and the third wire are generated in accordance with the mobile industry processor interface (MIPI)C-PHY standard.

In one embodiment, the selector of each of the plurality of the signal transition detectors comprises a first transmission gate, a second transmission gate, and a latch. The first transmission gate is connected between a first input node receiving the first input signal and an output node outputting the corresponding one of the detection signals. The second transmission gate is connected between a second input node receiving the second input signal and the output node. The latch is configured to control the first transmission gate and the second transmission gate.

In one embodiment, the latch of the selector of each of the plurality of signal transition detectors comprises a first node and a second node which hold complementary logical values. The state setting circuitry comprises first and second MOS transistors connected in series between the first node and a node of a first potential. The third and fourth MOS transistors are connected in series between the second node and a node of the first potential. Further, the recovered clock signal is supplied to gates of the first MOS transistor and the third MOS transistor, the first input signal is supplied to a gate of the second MOS transistor, and the second input signal is supplied to a gate of the fourth MOS transistor.

In one embodiment, each of the first MOS transistor, the second MOS transistor, the third MOS transistor, and the fourth MOS transistor comprises an NMOS transistor, and the first potential is a circuit ground potential.

In one embodiment, each of the plurality of signal transition detectors comprises a first delay element connected between the first transmission gate and one of the first input node and the second input node, and a second delay element connected between the second transmission gate and the other of the first input node and the second input node.

In one embodiment, the first delay element consists of one inverter, and the second delay element consists of one inverter.

In one embodiment, the dynamic OR circuitry comprises a fifth MOS transistor, a sixth MOS transistor, and a seventh MOS transistor which are connected in parallel between a dynamic node and a node of a first potential. A first detection signal of the detection signals is supplied to a gate of the fifth MOS transistor from a first signal transition detector of the plurality of signal transition detectors. A second detection signal of the detection signals is supplied to a gate of the sixth MOS transistor from a second signal transition detector of the plurality of the detection detectors. Further, the third detection signal of the detection signals is supplied to a gate of the seventh MOS transistor from a third signal transition detector of the plurality of signal transition detectors.

In one embodiment, each of the fifth MOS transistor, the sixth MOS transistor, and the seventh MOS transistor comprises an NMOS transistor, and the first potential is a circuit ground potential.

In one embodiment, a data transfer system comprises transmitter circuitry and receiver circuitry. The transmitter circuitry is configured to output data signals to a first wire, a second wire, and a third wire, respectively. The receiver circuitry comprises a first differential receiver and a second differential receiver, each comprising inputs connected to a different two of the first wire, the second wire, and the third wire. The receiver circuitry further comprises a first signal transition detector, a second signal transition detector, and dynamic OR circuitry. The first signal transition detector and the second signal transition detector are configured to receive a first input signal and a second input signal from the first and second differential receivers, respectively, and the first input signal and the second input signal are complementary to each other. Further, the dynamic OR circuitry is configured to output a recovered clock signal based on a logical sum of detection signals outputted from the first and second signal transition detectors.

In one embodiment, the transmitter circuitry is configured to generate the data signals transmitted over the first, second, and third wires in accordance with the MIPI C-PHY standard.

In one embodiment, a method of operating semiconductor circuitry comprises respectively outputting detection signals from a plurality of signal transition detectors based on a transition of at least one of a plurality of signals, and outputting a recovered clock signal based on a logical sum of the detection signals by dynamic OR circuitry.

In one embodiment, outputting the detection signals comprises supplying a first input signal and a second input signal to each of the plurality of signal transition detectors based on the transition of the at least one of the plurality of signals, in each of the plurality of signal transition detectors, selecting a corresponding one of the detection signals between the first input signal and the second input signal by a selector, and in each of the plurality of signal transition detectors, setting a state of the selector based on the recovered clock signal, the first input signal, and the second input signal.

In one embodiment, the plurality of signal transition detectors comprises first, second, and third signal transition detectors. Further, the first input signal and the second input signal supplied to the first signal transition detector are generated by a first differential receiver comprising an input connected to a first wire and an input connected to a second wire. The first input signal and the second input signal supplied to the second signal transition detector are generated by a second differential receiver comprising an input connected to the second wire and an input connected to a third wire. Further, the first input signal and the second input signal supplied to the third signal transition detector are generated by a third differential receiver comprising an input connected to the third wire and an input connected to the first wire.

Two or more of the above-described embodiments may be combined in an actual implementation as long as no technical inconsistency occurs.

What is claimed is:
1. Semiconductor circuitry comprising:
a plurality of signal transition detectors configured to respectively output detection signals based on a transition of at least one of a plurality of signals, each of the signal transition detectors comprises:

a selector configured to receive a first input signal and a second input signal generated based on the at least one of the plurality of signals and output one of the first input signal and the second input signal as a corresponding one of the detection signals, the first input signal and the second input signal being complementary to each other; and state setting circuitry configured to set a state of the selector based on an output signal, the first input signal, and the second input signal; and dynamic OR circuitry configured to output the output signal based on a logical sum of the detection signals.

2. The semiconductor circuitry according to claim 1, further comprising:

one or more differential receivers comprising inputs connected to different wires, wherein the one or more differential receivers is configured to supply the first input signal and the second input signal of a corresponding signal transition detector of the plurality of signal transition detectors.

3. The semiconductor circuitry according to claim 1, wherein the selector of each of the plurality of the signal transition detectors comprises:

a first transmission gate connected between a first input node receiving the first input signal and an output node outputting the corresponding one of the detection signals;

a second transmission gate connected between a second input node receiving the second input signal and the output node; and a latch configured to control the first transmission gate and the second transmission gate.

4. The semiconductor circuitry according to claim 3, wherein allowed states of the latch of the selector of each of the plurality of signal transition detectors comprise a first state in which the first transmission gate is turned on and the second transmission gate is turned off and a second state in which the first transmission gate is turned off and the second transmission gate is turned on.

5. The semiconductor circuitry according to claim 4, wherein the state setting circuitry is configured to set the latch of the selector of each of the plurality of signal transition detectors to one of the first state and the second state based on the first input signal and the second input signal, when the state setting circuitry is enabled based on the output signal.

6. The semiconductor circuitry according to claim 3, wherein each of the plurality of signal transition detectors further comprises:

a first delay element connected between the first transmission gate and one of the first input node and the second input node; and a second delay element connected between the second transmission gate and the other of the first input node and the second input node.

7. The semiconductor circuitry according to claim 1, wherein the dynamic OR circuitry comprises a plurality of MOS transistors connected in parallel between a dynamic node and a node of a first potential, and wherein the detection signals are respectively supplied to gates of the plurality of MOS transistors from the plurality of signal transition detectors.

8. The semiconductor circuitry according to claim 2, wherein the one or more different receivers comprises:

a first differential receiver comprising a first input connected to a first wire and a second input connected to a second wire, wherein the first differential receiver is configured to supply the first input signal and the second input signal of a first signal transition detector of the plurality of signal transition detectors;

a second differential receiver comprising a first input connected to the second wire and a second input connected to a third wire, wherein the second differential receiver is configured to supply the first input signal and the second input signal of a second signal transition detector of the plurality of signal transition detectors; and a third differential receiver comprising a first input connected to the third wire and a second input connected to the first wire, wherein the third differential receiver is configured to supply the first input signal and the second input signal of a third signal transition detector of the plurality of signal transition detectors.

9. Semiconductor circuitry comprising:

a plurality of signal transition detectors configured to respectively output detection signals based on a transition of at least one of a plurality of signals; and dynamic OR circuitry configured to output a recovered clock signal based on a logical sum of the detection signals, wherein the dynamic OR circuitry further comprises:

a first inverter comprising an input connected to a dynamic node; and a second inverter comprising an input connected to an output of the first inverter and an output connected to the dynamic node, and wherein the recovered clock signal is outputted from the first inverter.

10. Semiconductor circuitry comprising:

a plurality of signal transition detectors configured to respectively output detection signals based on a transition of at least one of a plurality of signals;

dynamic OR circuitry configured to output a recovered clock signal based on a logical sum of the detection signals; and precharge circuitry configured to precharge a dynamic node based on the recovered clock signal, wherein the precharge circuitry comprises:

a first delay circuitry configured to assert a precharge signal when a preset delay time lapses after the recovered clock signal is asserted and deassert the precharge signal immediately after the recovered clock signal is deasserted; and an MOS transistor configured to precharge the dynamic node based on an assertion of the precharge signal.

11. The semiconductor circuitry according to claim 10, further comprising automatic setting circuitry configured to set a delay time of the first delay circuitry based on at least one signal of the detection signals and a resultant signal generated based on the detection signals.

12. The semiconductor circuitry according to claim 11, wherein the first delay circuitry comprises a plurality of first unit delay elements, wherein the automatic setting circuitry comprises:

ring oscillator (ROSC) enable signal generator circuitry configured to generate an ROSC enable signal based on the at least one signal of the detection signals and the resultant signal;

an ROSC configured to output an oscillation output signal based on the ROSC enable signal, the ROSC comprises:

second delay circuitry comprising a plurality of second unit delay elements configured as replicas of the first unit delay elements; and a feedback path configured to feed back an output of the second delay circuitry to an input thereof; and a mask counter configured to count pulses in the oscillation output signal, and wherein the delay time of the first delay circuitry is set based on a count value of the mask counter.

13. The semiconductor circuitry according to claim 12, wherein the ROSC enable signal generator circuitry is configured to generate the ROSC enable signal so that a pulse appears in the ROSC enable signal, the pulse having a pulse width of an integer multiple of an unit interval (UI).

14. The semiconductor circuitry according to claim 11, wherein the first delay circuitry is configured to operate as a ring oscillator ROSC, wherein the automatic setting circuitry comprises:
ROSC enable signal generator circuitry configured to generate an ROSC enable signal based on the at least one signal of the detection signals and the resultant signal; and
a mask counter, wherein the first delay circuitry is configured to output an oscillation output signal based on the ROSC enable signal when operating as the ROSC, wherein the mask counter is configured to count pulses in the oscillation output signal, and wherein the delay time of the first delay circuitry is set based on a count value of the mask counter.

15. A data transfer system comprising:
transmitter circuitry configured to output data signals to a first wire, a second wire, and a third wire, respectively; and receiver circuitry comprising:
a first differential receiver and a second differential receiver, each comprising inputs connected to a different two of the first wire, the second wire, and the third wire;
a first signal transition detector and a second signal transition detector configured to receive a first input signal and a second input signal from the first and second differential receivers, respectively, the first input signal and the second input signal being complementary to each other; and
dynamic OR circuitry configured to output a recovered clock signal based on a logical sum of detection signals outputted from the first and second signal transition detectors.

16. The data transfer system according to claim 15, wherein each of the first and second signal transition detectors comprises:
a selector configured to receive the first input signal and the second input signal from a corresponding one of the first and second differential receivers and output one of the first input signal and the second input signal as a corresponding one of the detection signals; and
state setting circuitry configured to set a state of the selector based on the recovered clock signal, the first input signal, and the second input signal.

17. The data transfer system according to claim 15, wherein the receiver circuitry further comprises:
a first data latch configured to latch the first input signal outputted from the first differential receiver and a second data latch configured to latch the second input signal outputted from the second differential receiver, in synchronization with the recovered clock signal.

18. A method of operating semiconductor circuitry, the method comprising:
respectively outputting detection signals from a plurality of signal transition detectors based on a transition of at least one of a plurality of signals; wherein outputting the detection signals comprises:
supplying a first input signal and a second input signal to a selector of each of the plurality of signal transition detectors based on the transition of the at least one of the plurality of signals;
outputting, by the selector of each of the plurality of signal transition detectors, one of the first input signal and the second input signal as a corresponding one of the detection signals, wherein the first input signal and the second input signal are complementary to each other; and
setting a state of the selector of each of the plurality of signal transition detectors based on a recovered clock signal, the first input signal, and the second input signal, wherein the recovered clock signal is based on a logical sum of the detection signals by dynamic OR circuitry; and
outputting the recovered clock signal.

* * * * *